(12) United States Patent
Matsumoto et al.

(10) Patent No.: US 12,068,407 B2
(45) Date of Patent: Aug. 20, 2024

(54) SEMICONDUCTOR DEVICE, COMMUNICATION MODULE, AND SEMICONDUCTOR DEVICE MANUFACTURING METHOD

(71) Applicant: SONY SEMICONDUCTOR SOLUTIONS CORPORATION, Kanagawa (JP)

(72) Inventors: Katsuji Matsumoto, Kanagawa (JP); Masashi Yanagita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 627 days.

(21) Appl. No.: 17/286,711

(22) PCT Filed: Sep. 20, 2019

(86) PCT No.: PCT/JP2019/036930
§ 371 (c)(1),
(2) Date: Apr. 19, 2021

(87) PCT Pub. No.: WO2020/090281
PCT Pub. Date: May 7, 2020

(65) Prior Publication Data
US 2021/0359120 A1   Nov. 18, 2021

(30) Foreign Application Priority Data
Oct. 31, 2018  (JP) ................................. 2018-204939

(51) Int. Cl.
*H01L 29/778* (2006.01)
*H01L 29/06* (2006.01)
(Continued)

(52) U.S. Cl.
CPC ...... *H01L 29/7786* (2013.01); *H01L 29/0607* (2013.01); *H01L 29/2003* (2013.01); *H01L 29/66462* (2013.01)

(58) Field of Classification Search
CPC ......... H01L 29/66431; H01L 29/66462; H01L 29/0607; H01L 29/778–7789; H01L 29/13064; H01L 29/15–158
See application file for complete search history.

(56) References Cited

U.S. PATENT DOCUMENTS

2014/0264274 A1* 9/2014 Nakayama ............ H01L 29/155
257/20
2015/0294921 A1* 10/2015 Viswanathan .......... H01L 21/28
257/256
(Continued)

FOREIGN PATENT DOCUMENTS

CN    104051515 A    9/2014
CN    105390539 A    3/2016
(Continued)

OTHER PUBLICATIONS

International Search Report prepared by the Japan Patent Office on Nov. 21, 2019, for International Application No. PCT/JP2019/036930.

*Primary Examiner* — Tucker J Wright
(74) *Attorney, Agent, or Firm* — Sheridan Ross PC

(57) ABSTRACT

A semiconductor device includes: a semiconductor substrate; a channel layer on the semiconductor substrate; a barrier layer on the channel layer; a gate electrode on the barrier layer via a gate insulating film; a source electrode and a drain electrode on the channel layer with the gate electrode interposed therebetween; a substrate opening that penetrates the channel layer and exposes the semiconductor substrate; an insulating film provided from upper parts of the gate electrode, the source electrode, and the drain electrode to an (Continued)

inner side of the substrate opening; and a wiring line layer on the insulating film, and electrically coupled to one of the gate electrode, the source electrode, and the drain electrode via an opening on the insulating film, in which at least a portion of the substrate opening is in an activation region in which the gate electrode, the source electrode, and the drain electrode are provided.

20 Claims, 17 Drawing Sheets

(51) Int. Cl.
*H01L 29/20* (2006.01)
*H01L 29/66* (2006.01)

(56) References Cited

U.S. PATENT DOCUMENTS

| 2017/0207142 A1 | 7/2017 | Viswanathan |
| 2018/0069085 A1* | 3/2018 | Laboutin ........... H01L 29/66462 |
| 2019/0237459 A1 | 8/2019 | Hiura et al. |

FOREIGN PATENT DOCUMENTS

| JP | 2009-302151 | 12/2009 |
| JP | 2012227456 A | 11/2012 |
| JP | 2016-111254 | 6/2016 |
| JP | 2017092384 A | 5/2017 |
| JP | 2017-228621 | 12/2017 |
| JP | 2018-064008 | 4/2018 |
| KR | 20140117840 A | 10/2014 |

* cited by examiner

SEMICONDUCTOR DEVICE, COMMUNICATION MODULE, AND SEMICONDUCTOR DEVICE MANUFACTURING METHOD

CROSS REFERENCE TO RELATED APPLICATIONS

This application is a national stage application under 35 U.S.C. 371 and claims the benefit of PCT Application No. PCT/JP2019/036930 having an international filing date of 20 Sep. 2019, which designated the United States, which PCT application claimed the benefit of Japanese Patent Application No. 2018-204939, filed 31 Oct. 2018, the entire disclosures of each of which are incorporated herein by reference.

TECHNICAL FIELD

The present disclosure relates to a semiconductor device, a communication module, and a semiconductor device manufacturing method.

BACKGROUND ART

A high electron mobility transistor (High Electron Mobility Transistor: HEMT) using a heterojunction of compound semiconductors has properties including a high withstand voltage, a high heat resistance, a high saturated electron velocity, and a high channel electron concentration as compared with other transistors. Accordingly, the HEMT is expected to be applied to a small and high-performance power device, a high-frequency device for communication, or the like.

In the HEMT, a two-dimensional electron gas is formed at an interface of a channel layer that is in contact with a barrier layer, by heterojunction of the channel layer and the barrier layer that are formed by different compound semiconductors. It is possible for the two-dimensional electron gas to function as a low-resistance channel because of its high electron mobility and high sheet-electron density.

In recent years, in order to reduce a leakage current, an MIS (Metal-Insulator-Semiconductor) gate structure in which a gate electrode is stacked on a barrier layer via a gate insulating film has been adopted for the HEMT. However, in the HEMT having the MIS gate structure, because a source electrode, a drain electrode, and a gate electrode are each in a floating state, a damage (Plasma (Process) Induced Damage: PID) occurs due to a plasma process during a manufacturing process.

The PID occurs when a wiring line or a via coupled to the gate electrode acts as an antenna during the plasma process. Specifically, the PID is generated when charges in a plasma are collected by the antenna and the thus-collected charges flow as a current into the gate insulating film. The PID creates a defect or a carrier trapping level at an interface between the gate insulating film and a semiconductor substrate or in the gate insulating film, which results in a variation in a threshold voltage of the HEMT.

In order to avoid an influence of the PID, for example, a technique as described in Patent Literature 1 below has been proposed. In order to protect a protection target MOSFET (Metal-Oxide-Semiconductor Field-Effect Transistor: MOSFET) from the PID, Patent Literature 1 describes providing a protective MOSFET in which a dummy antenna is coupled to a gate electrode.

CITATION LIST

Patent Literature

Patent Literature 1: Japanese Unexamined Patent Application Publication No. 2018-64008

SUMMARY OF THE INVENTION

However, because a technique described in Patent Literature 1 described above is a technique related to MOSFET, a technique has been demanded that suppresses an influence of PID in HEMT.

According to one embodiment of the present disclosure, there is provided a first semiconductor device including: a semiconductor substrate; a channel layer formed on the semiconductor substrate and includes a first compound semiconductor; a barrier layer formed on the channel layer and includes a second compound semiconductor that is different from the first compound semiconductor; a gate electrode provided on the barrier layer via a gate insulating film; a source electrode and a drain electrode provided on the channel layer with the gate electrode interposed therebetween; a substrate opening that penetrates the channel layer and exposes the semiconductor substrate; an insulating film provided from upper parts of the gate electrode, the source electrode, and the drain electrode to an inner side of the substrate opening; and a wiring line layer provided on the insulating film, and electrically coupled to one of the gate electrode, the source electrode, and the drain electrode via an opening provided on the insulating film, in which at least a portion of the substrate opening is formed in an activation region in which the gate electrode, the source electrode, and the drain electrode are provided.

According to one embodiment of the present disclosure, there is provided a second semiconductor device including: a semiconductor substrate; a channel layer formed on the semiconductor substrate and includes a first compound semiconductor; a barrier layer formed on the channel layer and includes a second compound semiconductor that is different from the first compound semiconductor; a gate electrode provided on the barrier layer via a gate insulating film; a source electrode and a drain electrode provided on the channel layer with the gate electrode interposed therebetween; a substrate opening that penetrates the channel layer and exposes the semiconductor substrate; an insulating film provided from upper parts of the gate electrode, the source electrode, and the drain electrode to an inner side of the substrate opening; and a low resistance region provided in vicinity of a surface, of the semiconductor substrate, that is on a side on which the substrate opening is provided, and having an electric resistivity lower than an electric resistivity of any other part of the semiconductor substrate, in which at least a portion of the low resistance region of the semiconductor substrate is exposed in the substrate opening.

According to one embodiment of the present disclosure, there is provided a communication module with a semiconductor device. The semiconductor device includes: a semiconductor substrate; a channel layer formed on the semiconductor substrate and includes a first compound semiconductor; a barrier layer formed on the channel layer and includes a second compound semiconductor that is different from the first compound semiconductor; a gate electrode provided on the barrier layer via a gate insulating film; a source electrode and a drain electrode provided on the channel layer with the gate electrode interposed therebetween; a substrate opening that penetrates the channel layer and exposes the semiconductor substrate; an insulating film provided from upper parts of the gate electrode, the source electrode, and the drain electrode to an inner side of the substrate opening; and a wiring line layer provided on the insulating film, and electrically coupled to one of the gate electrode, the source electrode, and the drain electrode via an opening provided on the insulating film, in which at least a portion of the substrate opening is formed in an activation region in which the gate electrode, the source electrode, and the drain electrode are provided.

According to one embodiment of the present disclosure, there is provided a semiconductor device manufacturing method including: forming, with a first compound semiconductor, a film of a channel layer on a semiconductor substrate; forming, with a second compound semiconductor that is different from the first compound semiconductor, a film of a barrier layer on the channel layer; forming a source electrode and a drain electrode on the channel layer; forming a gate electrode via a gate insulating film on the barrier layer between the source electrode and the drain electrode; forming a substrate opening at a portion of an activation region in which the gate electrode, the source electrode, and the drain electrode are provided, in which the substrate opening penetrates the channel layer; forming a film of an insulating film from upper parts of the gate electrode, the source electrode, and the drain electrode to an inner side of the substrate opening; forming an opening on the insulating film while exposing the semiconductor substrate via the substrate opening, in which the opening exposes one of the gate electrode, the source electrode, and the drain electrode; and forming a wiring line layer on the insulating film, in which the wiring line layer is electrically coupled to one of the gate electrode, the source electrode, and the drain electrode via the opening formed on the insulating film.

MODES FOR CARRYING OUT THE INVENTION

Figure 1:
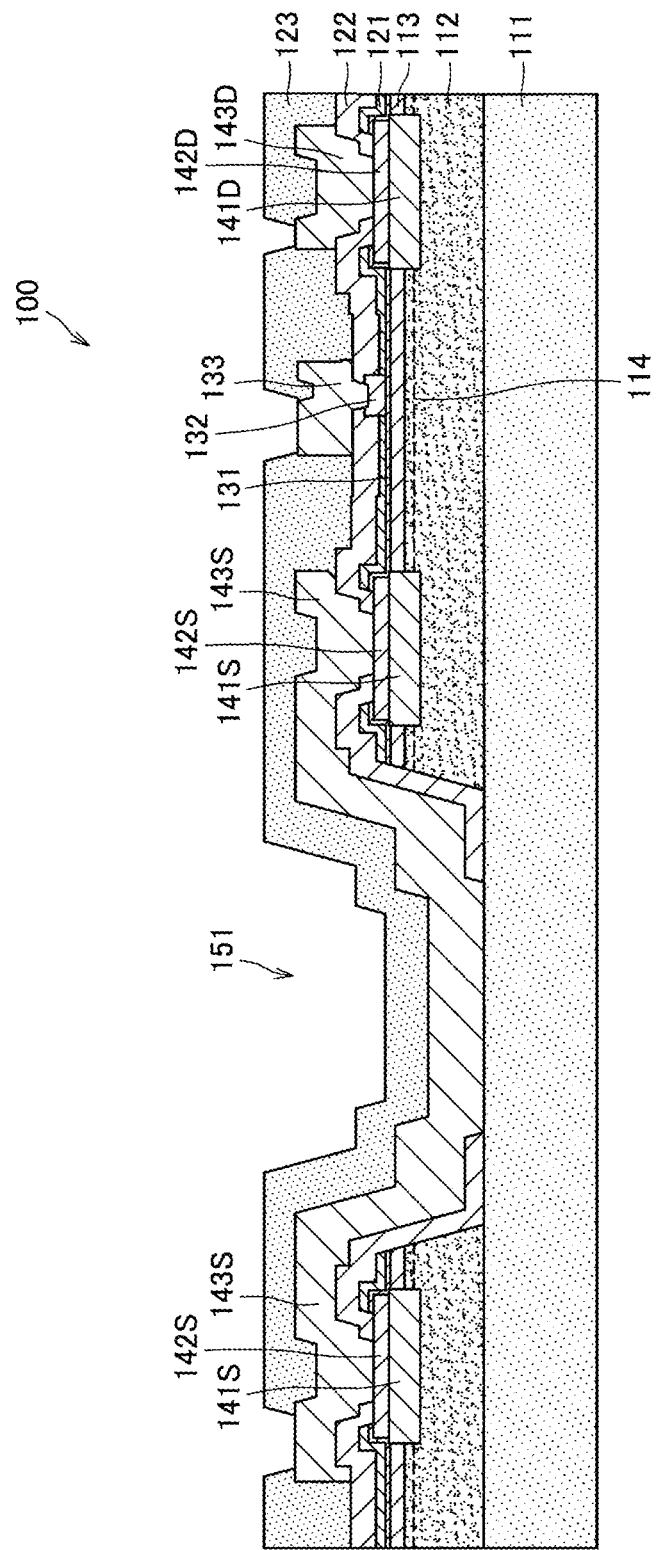
FIG. 1 is a vertical cross-sectional diagram schematically illustrating a stack structure of a semiconductor device according to an embodiment of the present disclosure.

In the following, a preferred embodiment of the present disclosure is described in detail with reference to the accompanying drawings.

Noted that, in this specification and the drawings, components having substantially the same function and configuration are denoted with the same reference numerals to omit any repetitive description.

It is to be noted that, in each drawing to be referred to in the following description, sizes of some components may sometimes be exaggerated for the sake of description. Accordingly, relative sizes of components illustrated in each drawing do not necessarily represent an exact magnitude relationship between the actual components. Further, in the following description, a stacking direction of a substrate and layers is represented as a vertical direction, and a direction in which the layers are stacked on the substrate or the like is represented as an upper direction.

It should be noted that the description is given in the following order.

1. Structure
2. Effect
3. Modification Examples
    3.1. First Modification Example
    3.2. Second Modification Example
    3.3. Third Modification Example 4. Manufacturing Method
    4.1. Semiconductor Device Manufacturing Method according to Embodiment, etc.
    4.2. Semiconductor Device Manufacturing Method according to Third Modification Example
5. Application Examples

1. STRUCTURE

First, referring to FIG. 1, a structural example of a semiconductor device according to an embodiment of the present disclosure will be described. FIG. 1 is a vertical cross-sectional diagram schematically illustrating a stack structure of the semiconductor device according to the present embodiment.

As illustrated in FIG. 1, a semiconductor device 100 includes a semiconductor substrate 111, a channel layer 112, a barrier layer 113, a gate insulating film 131, a gate electrode 132, a gate wiring line layer 133, a first insulating film 121, a second insulating film 122, a third insulating film 123, a source contact layer 141S, a source electrode 142S, a source wiring line layer 143S, a drain contact layer 141D, a drain electrode 142D, and a drain wiring line layer 143D. That is, the semiconductor device 100 is a so-called high electron mobility transistor (HEMT).

The respective configurations described above are provided in an activation region defined by an element separation region. The element separation region is, for example, a high-resistance region obtained by introducing boron (B) into the channel layer 112 and the barrier layer 113. As a result, a channel of the semiconductor device 100 is not formed in the element separation region, but is formed only in the activation region. Accordingly, the semiconductor device 100 is electrically insulated from any other semiconductor device or the like by the element separation region.

Note that, in the following, in a case of not distinguishing each of the source contact layer 141S and the drain contact layer 141D from each other, they are also collectively referred to as a contact layer 141. In addition, in a case of not distinguishing the gate wiring line layer 133, the source wiring line layer 143S, and the drain wiring line layer 143D from each other, they are also collectively referred to as a wiring line layer 143.

The semiconductor substrate 111 is a support for the respective components of the semiconductor device 100. The semiconductor substrate 111 may be, for example, a silicon substrate. More specifically, the semiconductor substrate 111 may be a silicon substrate having a high resistivity such that the silicon substrate has an electric resistivity of 1000 Ω·cm or more for a countermeasure against noise.

Although not illustrated in FIG. 1, a buffer layer may be provided between the semiconductor substrate 111 and the channel layer 112. The buffer layer is a layer that adjusts the mismatch between a lattice constant of the semiconductor substrate 111 and a lattice constant of the channel layer 112, thereby improving a crystalline state of the channel layer 112. The buffer layer is also a layer that suppresses a warpage of the semiconductor substrate 111 after formation of the channel layer 112. Specifically, it is possible to form the buffer layer by epitaxially growing a compound semiconductor having a lattice constant close to a lattice constant of a first compound semiconductor that forms the channel layer 112. For example, in a case where the semiconductor substrate 111 includes silicon and the channel layer 112 includes GaN, the buffer layer may include AlN, AlGaN, or GaN.

The channel layer 112 includes the first compound semiconductor, and is provided on the semiconductor substrate 111. It is possible for the channel layer 112 to accumulate electrons at an interface with the barrier layer 113 owing to a difference in amount of polarized charges relative to the barrier layer 113. Thus, it is possible for the channel layer 112 to form a two-dimensional electron gas 114 that functions as a channel of a transistor at the interface with the barrier layer 113. Specifically, it is possible to form the channel layer 112 by a nitride semiconductor. For example, it is possible to form the channel layer 112 as an epitaxially grown layer of $Al_{1-a-b}Ga_aIn_bN$ (where $0 \le a \le 1$, $0 \le b \le 1$, and $a+b \le 1$).

The barrier layer 113 includes a second compound semiconductor that is different from the first compound semiconductor, and is provided on the channel layer 112. The barrier layer 113 causes electrons to accumulate at a surface of the channel layer 112 owing to the difference in amount of polarized charges relative to the channel layer 112. Specifically, it is possible to form the barrier layer 113 by a nitride semiconductor that is different from that of the channel layer 112. For example, it is possible to form the barrier layer 113 as an epitaxially grown layer of $Al_{1-c-d}Ga_cIn_dN$ (where $0 \le c \le 1$, $0 \le d \le 1$, $c+d \le 1$, and $(c, d) \ne (a, b)$).

Further, the barrier layer 113 may include $Al_{1-c-d}Ga_cIn_dN$ to which no impurity is added (that is, undoped). In such a case, the barrier layer 113 is able to suppress an impurity scattering of the electrons in the channel layer 112, making it possible to further increase an electron mobility of the two-dimensional electron gas 114.

The gate insulating film 131 includes a dielectric having an insulating property, and is provided on the barrier layer 113. Specifically, the gate insulating film 131 is provided on the barrier layer 113 in a region of the activation region, excluding a region where the source electrode 142S or the drain electrode 142D is provided. For example, it is possible to form the gate insulating film 131 by a high dielectric material such as $HfO_2$.

The gate electrode 132 includes an electrically conductive material, and is provided on the barrier layer 113 via the gate insulating film 131. Specifically, the gate electrode 132 is provided in a region that crosses the activation region in which the two-dimensional electron gas 114 serving as the channel is formed. Thus, it is possible for the gate electrode 132 to control, on the basis of an applied voltage, an electric resistance of the two-dimensional electron gas 114 serving as the channel. It is possible to form the gate electrode 132 by sequentially stacking nickel (Ni) and gold (Au) from the gate insulating film 131 side, for example.

That is, in the semiconductor device 100, an MIS gate structure is formed in which the gate electrode 132 is provided on the barrier layer 113 via the gate insulating film 131. According to the MIS gate structure, it is possible for the semiconductor device 100 to further reduce the leakage current.

The source electrode 142S and the drain electrode 142D are each provided on the barrier layer 113 with the gate electrode 132 interposed therebetween. The source electrode 142S is electrically coupled to the two-dimensional electron gas 114 formed at the channel layer 112, via the source contact layer 141S provided below the source electrode 142S. In addition, the drain electrode 142D is electrically coupled to the two-dimensional electron gas 114 formed at the channel layer 112, via the drain contact layer 141D provided below the drain electrode 142D. It is possible to form the source electrode 142S and the drain electrode 142D by sequentially stacking titanium (Ti), aluminum (Al), nickel (Ni), and gold (Au) from the source contact layer 141S side or from the drain contact layer 141D side, for example.

The contact layer 141 (i.e., the source contact layer 141S and the drain contact layer 141D) includes a compound semiconductor into which an electrically conductive type impurity is introduced. The contact layer 141 is provided below each of the source electrode 142S and the drain electrode 142D so as to penetrate the barrier layer 113 and reach the channel layer 112.

Specifically, because the contact layer 141 is formed using the same compound semiconductor as the channel layer 112 or a compound semiconductor having a small band gap with respect to the channel layer 112, a contact resistance with the two-dimensional electron gas 114 of the channel layer 112 is low. In addition, because the electrically conductive type impurity is introduced into the contact layer 141 at a high concentration, contact resistances with the source electrode 142S and the drain electrode 142D become low. Accordingly, it is possible for the contact layer 141 to reduce the contact resistances between the source electrode 142S and drain electrode 142D and the two-dimensional electron gas 114.

For example, it is possible to form the contact layer 141 using a nitride semiconductor into which an n-type impurity is introduced. More specifically, it is possible to form the contact layer 141 by introducing silicon (Si), germanium (Ge), or the like at an amount of $1 \times 10^{18}$ pieces/cm$^3$ or more to an epitaxially grown layer of $Al_{1-e-f}Ga_eIn_fN$ (where $0 \le e \le 1$, $0 \le f \le 1$, and $e+f \le 1$).

The first insulating film 121 includes an insulating material, and is provided on the gate insulating film 131. The second insulating film 122 includes an insulating material, and is provided on the first insulating film 121. In particular, the second insulating film 122 is provided from upper parts of the gate electrode 132, the source electrode 142S, and the drain electrode 142D to an inner side of a substrate opening 151. The second insulating film 122 may be provided on a side surface of the inner side and a portion of a bottom surface of the substrate opening 151, or may be provided on a portion of the side surface of the inner side of the substrate opening 151.

The first insulating film 121 and the second insulating film 122 are provided between the gate electrode 132, the source electrode 142S, and the drain electrode 142D and the wiring line layer 143 (i.e., the gate wiring line layer 133, the source wiring line layer 143S, and the drain wiring line layer 143D), so that the gate electrode 132, the source electrode 142S, and the drain electrode 142D are electrically coupled to the wiring line layer 143 through predetermined openings.

The first insulating film 121 and the second insulating film 122 may be formed, for example, as a monolayer film or a laminate film of an insulating material such as $SiO_2$, SiN, or $Al_2O_3$. Note that the first insulating film 121 and the second insulating film 122 may include the same insulating material or may include different insulating materials. In a case where the first insulating film 121 and the second insulating film 122 include the insulating materials different from each other, it is possible to improve etching controllability by controlling an etching selectivity of each of the first insulating film 121 and the second insulating film 122.

The wiring line layer 143 (i.e., the gate wiring line layer 133, the source wiring line layer 143S, and the drain wiring line layer 143D) includes an electrically conductive material, and is disposed on the second insulating film 122. It is possible to form the wiring line layer 143 by, for example, sequentially stacking titanium (Ti), platinum (Pt), and gold (Au) from the second insulating film 122 side.

The third insulating film 123 includes an insulating material, and is provided on the wiring line layer 143. Specifically, the third insulating film 123 is formed entirely over the semiconductor substrate 111, and functions as a passivation film that protects the wiring line layer 143 serving as a lower layer. It is possible to form the third insulating film 123 as a monolayer film of SiN, for example.

Here, in the semiconductor device 100 according to the present embodiment, the substrate opening 151 that penetrates the channel layer 112 and exposes the semiconductor substrate 111 is provided in the activation region in which the respective components of the semiconductor device 100 are provided. However, at least a portion of the substrate opening 151 may be formed in the activation region, and not all of the substrate opening 151 may be formed in the activation region. That is, a portion of the substrate opening 151 may be formed in the element separation region.

The substrate opening 151 is provided to expose the semiconductor substrate 111 during a plasma process to allow charges in a plasma to escape to the semiconductor substrate 111. In the semiconductor device 100, it is possible to suppress accumulation of the charges at the gate electrode 132, the source electrode 142S, and the drain electrode 142D at the time of the plasma process by providing the substrate opening 151. Accordingly, in the semiconductor device 100, it is possible to suppress the charges accumulated at each of the electrodes from flowing as a current into the gate insulating film 131, making it possible to suppress the generation of PID in the plasma process during a manufacturing process.

For example, the second insulating film 122 is first formed in the substrate opening 151 from the upper parts of the gate electrode 132, the source electrode 142S, and the drain electrode 142D to the inner side and the bottom surface of the substrate opening 151. Next, the plasma process forms the openings on the second insulating film 122 that expose portions of the gate electrode 132, the source electrode 142S, and the drain electrode 142D. At this time, at least a portion of the second insulating film 122 at the bottom surface of the substrate opening 151 is removed, so that the semiconductor substrate 111 is exposed. As a result, it is possible to allow the charges generated in the plasma process to escape to the exposed semiconductor substrate 111 inside the substrate opening 151, and to suppress the generation of the PID in the semiconductor device 100.

Note that it is sufficient for the substrate opening 151 to expose the semiconductor substrate 111 during the plasma process that generates the PID. Accordingly, a wiring line layer, an insulating film, or the like may be formed at the inner side of the substrate opening 151 following the plasma process. Specifically, it is sufficient for the substrate opening 151 to be capable of exposing the semiconductor substrate 111 during an etch process that forms the openings on the second insulating film 122 to form electrical connections between the gate electrode 132, the source electrode 142S, and the drain electrode 142D and the wiring line layer 143. Accordingly, the source wiring line layer 143S and the third insulating film 123 formed in subsequent processes may be formed at the inner side of the substrate opening 151.

It is sufficient for at least a portion of the substrate opening 151 to be provided in the activation region. More specifically, the substrate opening 151 is preferably provided in the activation region on the source electrode 142S side with respect to the gate electrode 132. In a transistor, a terminal on the ground side serves as a source and a terminal on the power source side serves as a drain. Hence, by providing the substrate opening 151 on the source electrode 142S side, it is possible to more easily allow the charges to escape to the semiconductor substrate 111 as the ground.

In a case where the substrate opening 151 is provided in the activation region on the source electrode 142S side, the substrate opening 151 may be so provided as to divide the source electrode 142S. Specifically, the substrate opening 151 may be so provided as to extend in a direction orthogonal to a direction in which the source electrode 142S and the drain electrode 142D are arranged, and may thereby divide the source electrode 142S into a plurality of pieces. The thus-divided source electrode 142S may be electrically coupled by, for example, the source wiring line layer 143S. In the HEMT, the source electrode 142S is electrically coupled to the two-dimensional electron gas 114, serving as the channel, at a side surface on the gate electrode 132 side of the source electrode 142S. Accordingly, in the HEMT, a size of the planar area of the source electrode 142S less influences the contact resistance between the source electrode 142S and the two-dimensional electron gas 114. Hence, in the semiconductor device 100, it is possible to allow, in the activation region on the source electrode 142S side, a large region that divides the source electrode 142S to serve as the substrate opening 151.

2. EFFECT

Figure 2A:
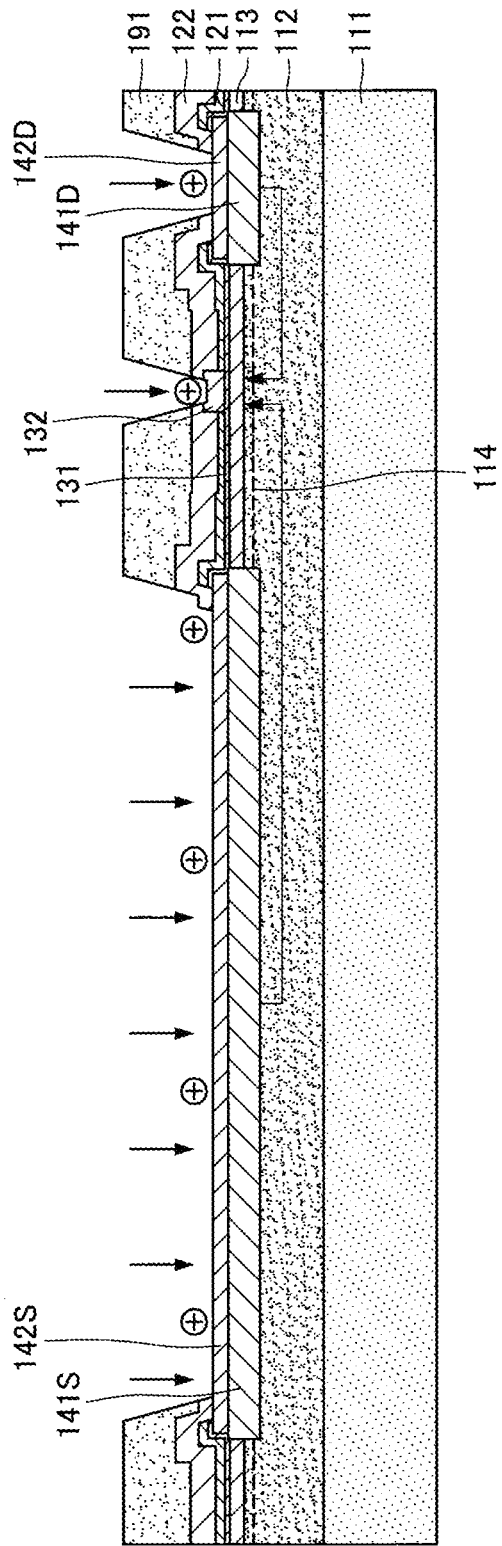
FIG. 2A is a schematic vertical cross-sectional diagram illustrating a behavior of charges at the time of a plasma process performed on a semiconductor device according to a comparative example.
Figure 2B:
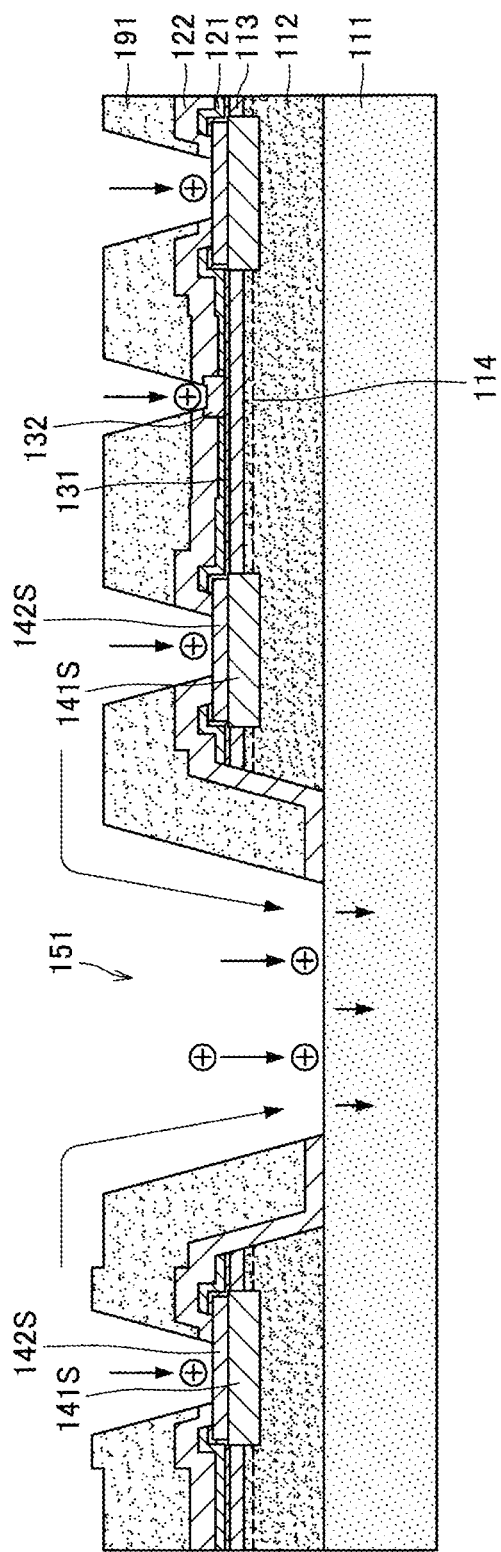
FIG. 2B is a schematic vertical cross-sectional diagram illustrating a behavior of the charges at the time of the plasma process performed on the semiconductor device according to the embodiment.

Next, referring to FIGS. 2A and 2B, an action mechanism and effects of suppressing the PID by the substrate opening 151 in the semiconductor device 100 will be described. FIG. 2A is a schematic vertical cross-sectional diagram illustrating a behavior of the charges at the time of the plasma process performed on a semiconductor device according to a comparative example. FIG. 2B is a schematic vertical cross-sectional diagram illustrating a behavior of the charges at the time of the plasma process performed on the semiconductor device 100 according to the present embodiment. Note that the semiconductor device according to the comparative example differs from the semiconductor device 100 according to the present embodiment only in that the substrate opening 151 is not provided.

As illustrated in FIG. 2A, in the semiconductor device according to the comparative example, the gate electrode 132, the source electrode 142S, and the drain electrode 142D on the barrier layer 113 are in a floating state in a process of etching the second insulating film 122 using a resist layer 191 as a mask. Accordingly, the gate electrode 132, the source electrode 142S, and the drain electrode 142D accumulate the charges when exposed to the plasma in the plasma process such as etching. Hence, an electric field generated by a difference in amount of accumulated charges causes a large current that passes through the gate insulating film 131 to flow from the source electrode 142S and the drain electrode 142D to the gate electrode 132. As a result, a defect or the like occurs in the gate insulating film 131, which leads to a variation in a threshold voltage that controls on and off of the channel of the semiconductor device and possibly lead to a generation of an operation failure consequently.

In contrast, as illustrated in the FIG. 2B, in the semiconductor device 100 according to the present embodiment, the semiconductor substrate 111 is exposed by the substrate opening 151 in the process of etching the second insulating film 122 using the resist layer 191 as a mask. Specifically, in the process of etching the second insulating film 122, the second insulating film 122 at the inner side of the substrate opening 151 is also etched in addition to the second insulating film 122 on the gate electrode 132, the source electrode 142S, and the drain electrode 142D. This exposes the semiconductor substrate 111 so that most of the charges caused by the plasma during the etching escape to the ground through the exposed semiconductor substrate 111. Accordingly, it is possible for the semiconductor device 100 to suppress the accumulation of the charges at each of the gate electrode 132, the source electrode 142S, and the drain electrode 142D at the time of the plasma process such as the etching, and to suppress the generation of the PID in the gate insulating film 131.

In order to more effectively suppress the accumulation of the charges at the gate electrode 132, the source electrode 142S, and the drain electrode 142D, it is preferable that the semiconductor substrate 111 be exposed prior to the exposure of the gate electrode 132, the source electrode 142S, and the drain electrode 142D to the plasma. For example, by making a thickness of the second insulating film 122 at the inner side of the substrate opening 151 thinner than a thickness of the second insulating film 122 on the gate electrode 132, the source electrode 142S, and the drain electrode 142D, it is possible to expose the semiconductor substrate 111 faster during the etching. Alternatively, it is also possible to expose the semiconductor substrate 111 in advance by etching the second insulating film 122 at the inner side of the substrate opening 151 prior to the process of etching the second insulating film 122 on the gate electrode 132, the source electrode 142S, and the drain electrode 142D.

3. MODIFICATION EXAMPLES

Figure 3:
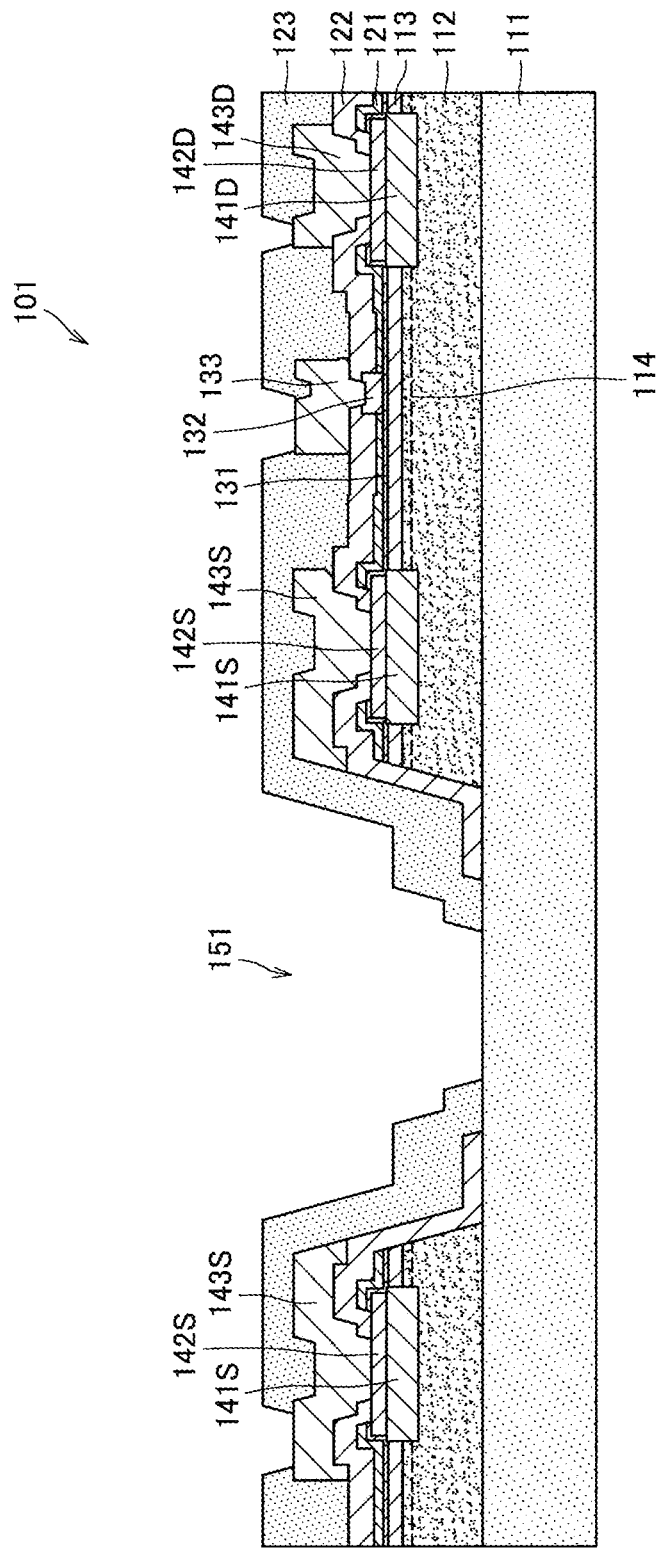
FIG. 3 is a vertical cross-sectional diagram schematically illustrating a stack structure of a semiconductor device according to a first modification example.
Figure 4:
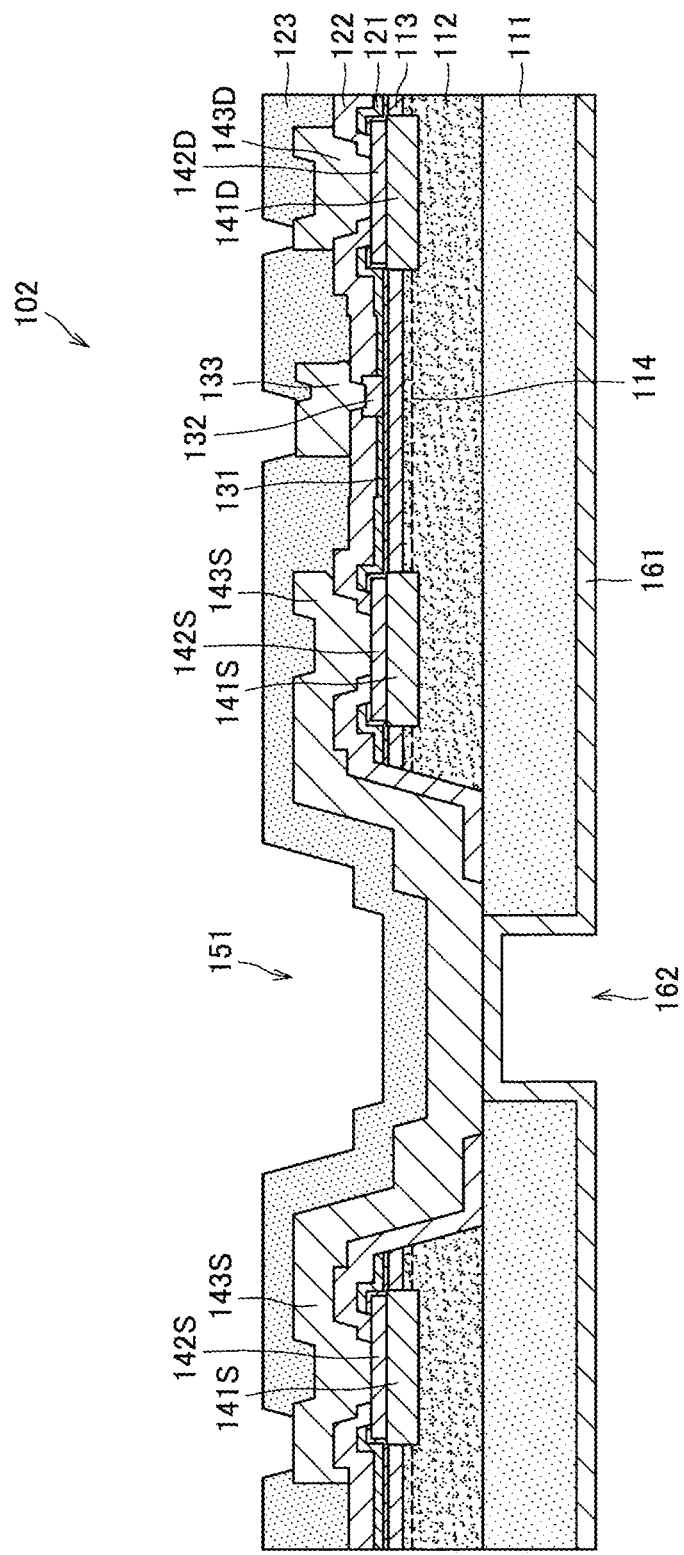
FIG. 4 is a vertical cross-sectional diagram schematically illustrating a stack structure of a semiconductor device according to a second modification example.

Next, referring to FIGS. 3 and 4, modification examples of the semiconductor device 100 according to the present embodiment will be described. FIG. 3 is a vertical cross-sectional diagram schematically illustrating a stack structure of a semiconductor device 101 according to a first modification example. FIG. 4 is a vertical cross-sectional diagram schematically illustrating a stack structure of a semiconductor device 102 according to a second modification example.

3.1. First Modification Example

As illustrated in FIG. 3, the semiconductor device 101 according to the first modification example differs from the semiconductor device 100 illustrated in FIG. 1, in that no source wiring line layer 143S is formed at the inner side of the substrate opening 151 and that the semiconductor substrate 111 is exposed.

In the semiconductor device 101, each source electrode 142S is electrically coupled by the unillustrated source wiring line layer 143S. Specifically, each source electrode 142S may be electrically coupled by the unillustrated source wiring line layer 143S so formed on the second insulating film 122 as to bypass the substrate opening 151.

In the semiconductor device 101 according to the first modification example, after the semiconductor substrate 111 is exposed by the substrate opening 151, the semiconductor substrate 111 is kept exposed. This allows the charges to escape to the semiconductor substrate 111 through the exposed semiconductor substrate 111 in the semiconductor device 101, even in the plasma process subsequent to the etching process of the second insulating film 122. Even in the semiconductor device 101 of such a configuration, it is possible to suppress the generation of the PID in the plasma process similarly to the semiconductor device 100 illustrated in FIG. 1.

3.2. Second Modification Example

As illustrated in FIG. 4, the semiconductor device 102 according to the second modification example differs from the semiconductor device 100 illustrated in FIG. 1, in that the semiconductor device 102 includes a conductor layer 161 electrically coupled to the source wiring line layer 143S from a surface positioned on an opposite side of a side on which the substrate opening 151 is provided.

Specifically, the semiconductor device 102 includes: an opening 162 that penetrates the semiconductor substrate 111 to expose the source wiring line layer 143S provided at the inner side of the substrate opening 151 from the surface positioned on the opposite side of the side on which the substrate opening 151 is provided; and the conductor layer 161 provided at an inner side of the opening 162 and along the surface, of the semiconductor substrate 111, that is positioned on the opposite side of the side on which the substrate opening 151 is provided.

The conductor layer 161 includes an electrically conductive material. Specifically, it is possible to form the conductor layer 161 by sequentially stacking titanium (Ti), platinum (Pt), and gold (Au) from the second insulating film 122 side.

The conductor layer 161 is, for example, a ground electrode for grounding the semiconductor device 102. The grounding (ground) of the HEMT used for a power amplifier or the like is generally performed using, for example, wire bonding. However, a wire length of the wire bonding is about several hundred micrometers; hence, in a case where the HEMT is used as a high-frequency application transistor used for a high frequency such as a millimeter-wave band, a gain reduction due to parasitic inductance of the wire becomes significant.

In the semiconductor device 102 according to the second modification example, it is possible to electrically couple the source wiring line layer 143S and the conductor layer 161 serving as the ground electrode to each other through the opening 162 that penetrates the semiconductor substrate 111. Thus, it is possible to allow the semiconductor device 102 to be grounded at low inductance without routing the wire or the wiring line.

In addition, in the semiconductor device 102 according to the second modification example, the source wiring line layer 143S is formed on the semiconductor substrate 111 by the substrate opening 151 provided to penetrate the channel layer 112. Accordingly, it is possible to form, by penetrating only the semiconductor substrate 111, the opening 162 that exposes the source wiring line layer 143S from the surface positioned on the opposite side of the side on which the substrate opening 151 is provided.

If the substrate opening 151 that penetrates the channel layer 112 is not formed, the opening 162, which exposes the source wiring line layer 143S from the surface positioned on the opposite side of the side on which the channel layer 112 is provided, is formed to penetrate the semiconductor substrate 111 and the channel layer 112. In such a case, because an etching device and an etching gas differ between the semiconductor substrate 111 that includes silicon or the like and the channel layer 112 that includes an AlGaInN-based compound, a manufacturing process of the semiconductor device 102 becomes complicated and a manufacturing efficiency is lowered consequently. In addition, because workability in the vicinity of interfaces of the semiconductor substrate 111 and the channel layer 112 is reduced, a possibility of causing a formation defect of the conductor layer 161 in the vicinity of the interfaces is increased.

In the semiconductor device 102 according to the second modification example, the opening 162 is formed by penetrating only the semiconductor substrate 111. Hence, it is possible to electrically couple the source wiring line layer 143S and the conductor layer 161 with higher reliability and in a simpler process.

In the semiconductor device 102 according to the second modification example, the conductor layer 161 allows for the grounding of lower inductance with higher reliability.

3.3. Third Modification Example

Figure 5:
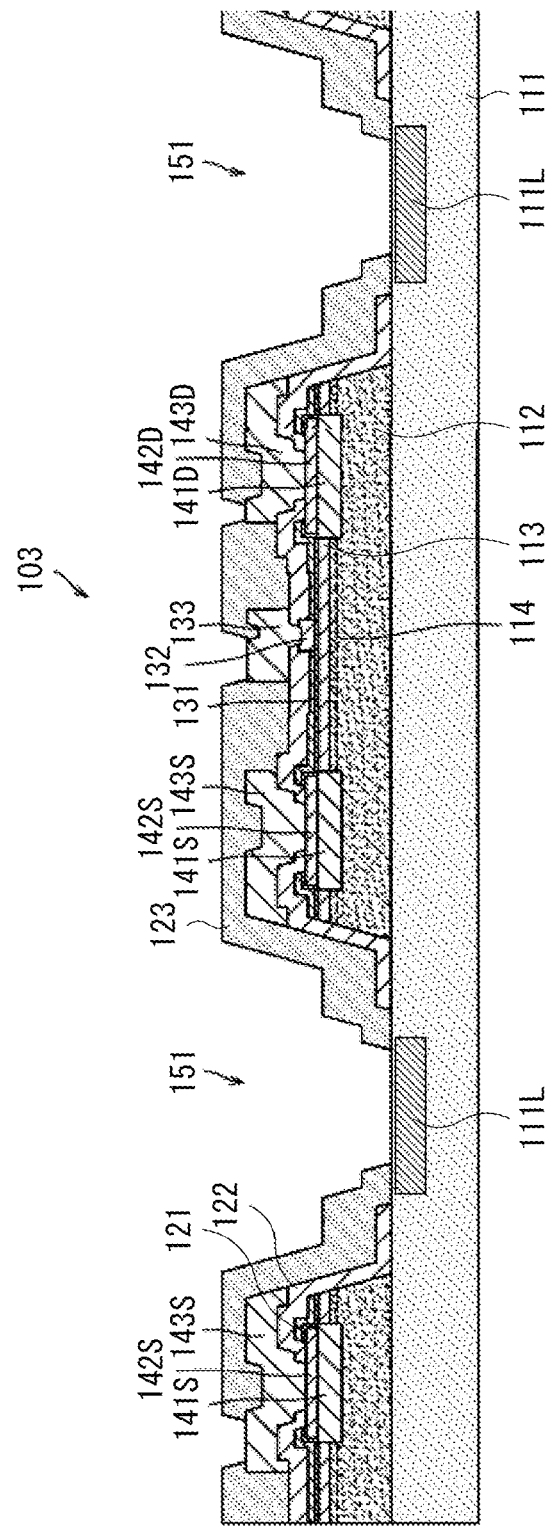
FIG. 5 is a vertical cross-sectional diagram schematically illustrating a stack structure of a semiconductor device according to a third modification example.

As illustrated in FIG. 5, a semiconductor device 103 according to a third modification example differs from the semiconductor device 100 illustrated in FIG. 1, in that a low resistance region 111L is provided on the semiconductor substrate 111 and that the low resistance region 111L is exposed by the substrate opening 151.

The substrate opening 151 may be provided in a region on the drain electrode 142D side in addition to the region on the source electrode 142S side with respect to the gate electrode 132 (FIG. 5). By increasing the number of substrate openings 151, it is possible to allow the charges to be easily escaped to the semiconductor substrate 111 that serves as the ground. Although illustration is omitted, the substrate opening 151 may be provided in only one of the region on the source electrode 142S side and the region on the drain electrode 142D side. In the semiconductor device 103, for example, the substrate opening 151 is disposed in the element separation region (a field section). As with the semiconductor device 100, at least a portion of the substrate opening 151 may be provided in the activation region. Although illustration is omitted, the wiring line layer 143 may not be provided in the semiconductor device 103.

The low resistance region 111L is provided in the vicinity of a surface, of the semiconductor substrate 111, on which the substrate opening 151 is provided. The low resistance region 111L is selectively disposed in a region corresponding to the substrate opening 151, for example, and extends in a direction parallel to an extending direction of the substrate opening 151. In the substrate opening 151, at least a portion of the low resistance region 111L is exposed. A width of the low resistance region 111L (i.e., a size in a direction orthogonal to an extending direction of the low resistance region 111L) is preferably larger than a width of the substrate opening 151, and the low resistance region 111L is preferably exposed on the entire bottom surface of the substrate opening 151. The low resistance region 111L may be exposed on a portion of the bottom surface of the substrate opening 151. The low resistance region 111L may be provided in the activation region or in the element separation region. For example, the low resistance region 111L may be provided in the vicinity of a scribe line (see FIG. 7B and FIG. 8B to be described later).

The low resistance region 111L is a region having an electric resistivity lower than an electric resistivity of any other part of the semiconductor substrate 111. For example, the low resistance region 111L has the electric resistivity of less than 1000 $\Omega \cdot cm$. The electric resistivity of the low resistance region 111L is, for example, 0.001 $\Omega \cdot cm$ to 100 $\Omega \cdot cm$. The low resistance region 111L is formed using, for example, ion implantation, and has an impurity concentration higher than an impurity concentration of a P-type impurity or an N-type impurity of any other part of the semiconductor substrate 111.

In the semiconductor device 103 according to the third modification example, the charges generated by the plasma during the etching in the process of etching the second insulating film 122 are easily diffused to the entire surface of the semiconductor substrate 111 via the low resistance region 111L. Accordingly, it is possible for the semiconductor device 103 to suppress the generation of the PID in plasma process more effectively than in the semiconductor device 100 illustrated in FIG. 1, owing to the low resistance region 111L of the semiconductor substrate 111.

4. MANUFACTURING METHOD

4.1. Semiconductor Device Manufacturing Method According to Embodiment, Etc.

Next, referring to FIGS. 6A to 6H, a method of manufacturing the semiconductor device 100 according to the present embodiment and the semiconductor device 102 according to the second modification example will be described. FIG. 6A to FIG. 6G are schematic vertical cross-sectional diagrams illustrating respective steps of the method of manufacturing the semiconductor device 100 according to the present embodiment. Further, FIG. 6H is a schematic vertical cross-sectional diagram for describing a process of manufacturing the semiconductor device 102 according to the second modification example from the semiconductor device 100.

Figure 6A:
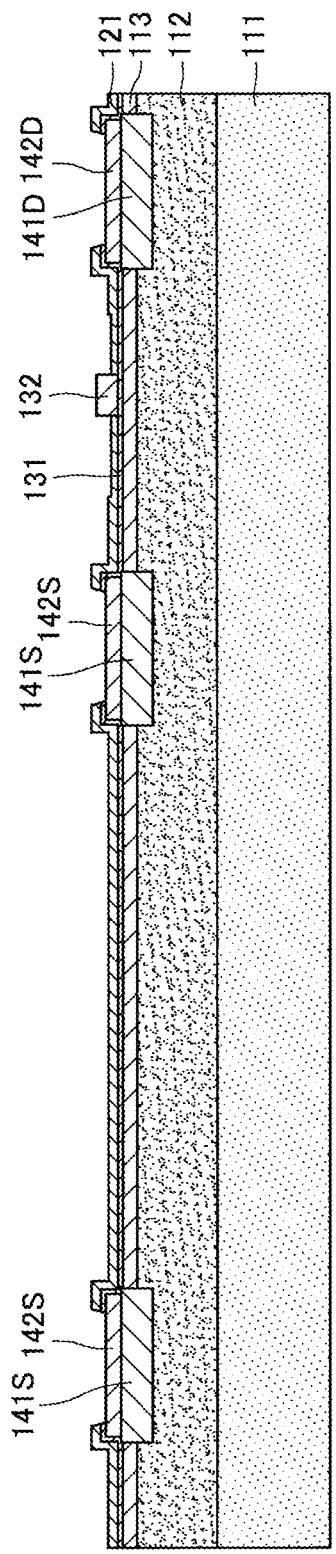
FIG. 6A is a schematic vertical cross-sectional diagram illustrating a step of a method of manufacturing the semiconductor device according to the embodiment.

First, as illustrated in FIG. 6A, the channel layer 112 and the barrier layer 113 are formed on the semiconductor substrate 111. Thereafter, the source electrode 142S and the drain electrode 142D are formed on the barrier layer 113. The gate insulating film 131 and the first insulating film 121 are formed, following which the gate electrode 132 is formed.

Specifically, the channel layer 112 is formed by epitaxially growing GaN on the semiconductor substrate 111 that includes silicon and has the electric resistivity of 1000 Ω·cm or more. Subsequently, AlInN is epitaxially grown on the channel layer 112 to form the barrier layer 113. Thereafter, wet etching or dry etching is performed with a patterned resist being used as a mask to form an opening that penetrates the barrier layer 113 and partially digs the channel layer 112.

Next, the contact layer 141 is formed on the channel layer 112 inside the thus-formed opening. At this time, the contact layer 141 may be formed by epitaxially growing GaN in a similar manner to the channel layer 112. The epitaxial growth of the contact layer 141 is also referred to as a crystal regrowth. The contact layer 141 may be formed to contain an n-type impurity by incorporating an n-type impurity such as Si or Ge during the crystal regrowth. Alternatively, the contact layer 141 may be formed to contain the n-type impurity by ion-implanting the n-type impurity such as Si or Ge after the crystal regrowth. A concentration of the n-type impurity to be introduced into the contact layer 141 may be, for example, $1 \times 10^{18}$ pieces/cm³ or more.

Subsequently, Ti, Al, Ni, and Au are sequentially stacked on each contact layer 141 to form the source electrode 142S and the drain electrode 142D.

Thereafter, although not illustrated, the element separation region is formed around the semiconductor device 100 to electrically insulate the semiconductor device 100 from another semiconductor device or the like. It is possible to form the element separation region, for example, by introducing boron (B) into the barrier layer 113 and the channel layer 112 by ion implantation to increase the resistivity of the barrier layer 113 and the channel layer 112.

Next, the gate insulating film 131 and the first insulating film 121 are sequentially formed uniformly on the source electrode 142S, the drain electrode 142D, and the barrier layer 113. It is possible to form the gate insulating film 131 by a high dielectric material such as $HfO_2$. In addition, it is possible to form the first insulating film 121 by SiN or the like. Subsequently, a portion of the first insulating film 121 between the source electrode 142S and the drain electrode 142D is opened, and Ni and Au are sequentially stacked on the gate insulating film 131 to form the gate electrode 132. At this time, the gate insulating film 131 and the first insulating film 121 on the source electrode 142S and the drain electrode 142D may also be partially opened.

Figure 6B:
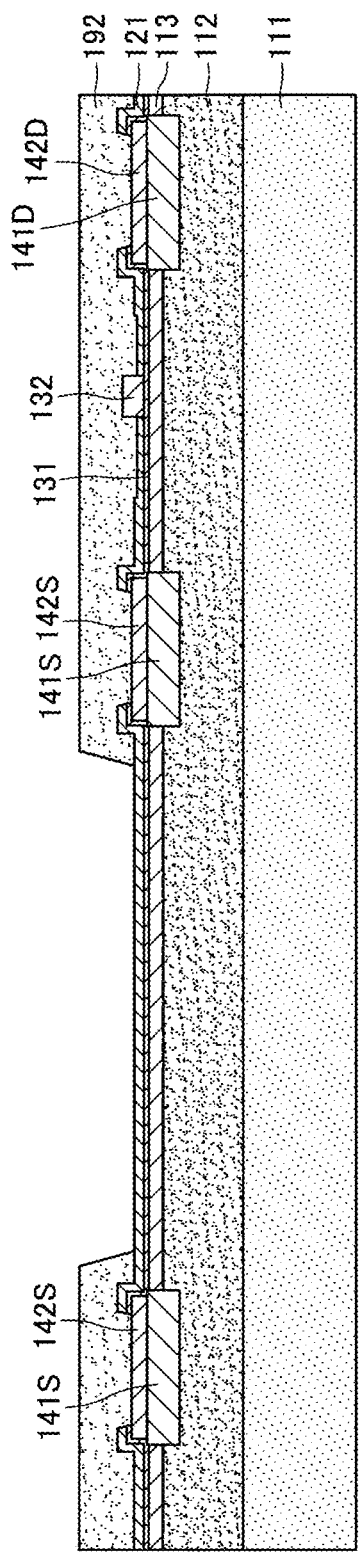
FIG. 6B is a schematic vertical cross-sectional diagram illustrating a step of the method of manufacturing the semiconductor device according to the embodiment.
Figure 6C:
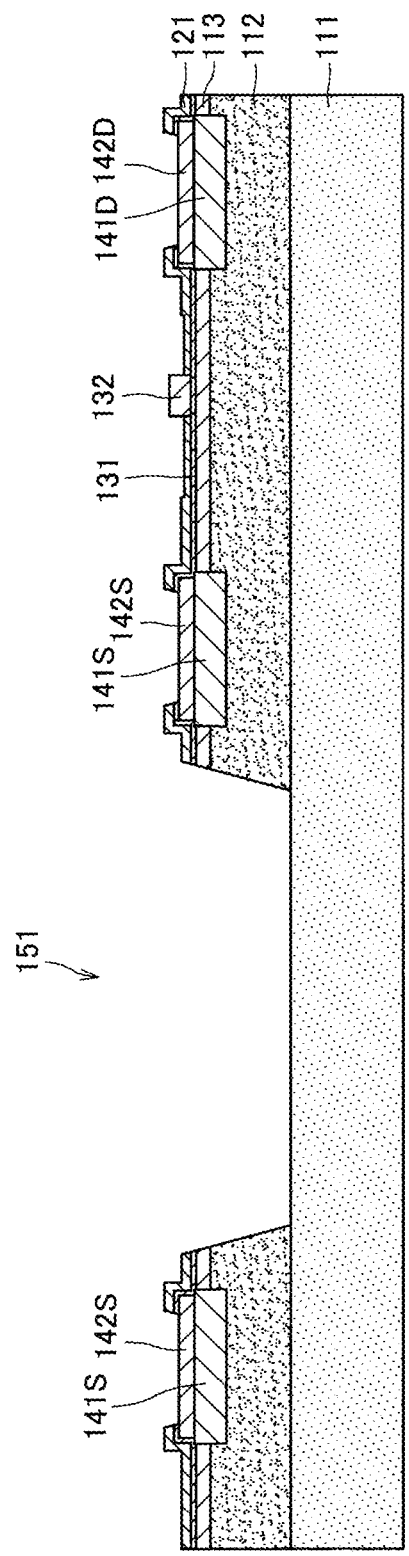
FIG. 6C is a schematic vertical cross-sectional diagram illustrating a step of the method of manufacturing the semiconductor device according to the embodiment.

Next, as illustrated in FIG. 6B, a resist layer 192 is formed on the first insulating film 121. The resist layer 192 is so pattered as to open a region corresponding to the substrate opening 151. Thereafter, as illustrated in FIG. 6C, using the resist layer 192 as a mask, the first insulating film 121 is removed by dry etching that uses CF4 and O2 gases, and the barrier layer 113 and the channel layer 112 are removed by dry etching that uses chlorine-based gas. This forms the substrate opening 151 that penetrates the channel layer 112 and exposes the semiconductor substrate 111. Note that the resist layer 192 is removed by ashing or the like.

Figure 6D:
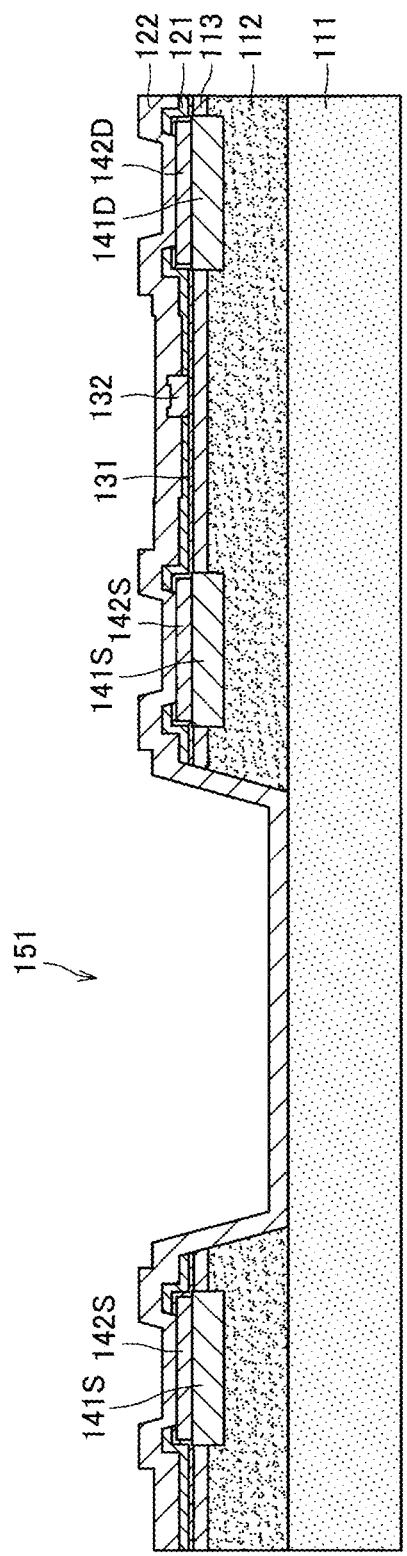
FIG. 6D is a schematic vertical cross-sectional diagram illustrating a step of the method of manufacturing the semiconductor device according to the embodiment.

Subsequently, as illustrated in FIG. 6D, the second insulating film 122 is uniformly formed on the first insulating film 121, the source electrode 142S, the drain electrode 142D, and the gate electrode 132. At this time, the second insulating film 122 is also formed on the semiconductor substrate 111 along the inner side of the substrate opening 151. It is possible to form the second insulating film 122 by $SiO_2$ or the like.

Figure 6E:
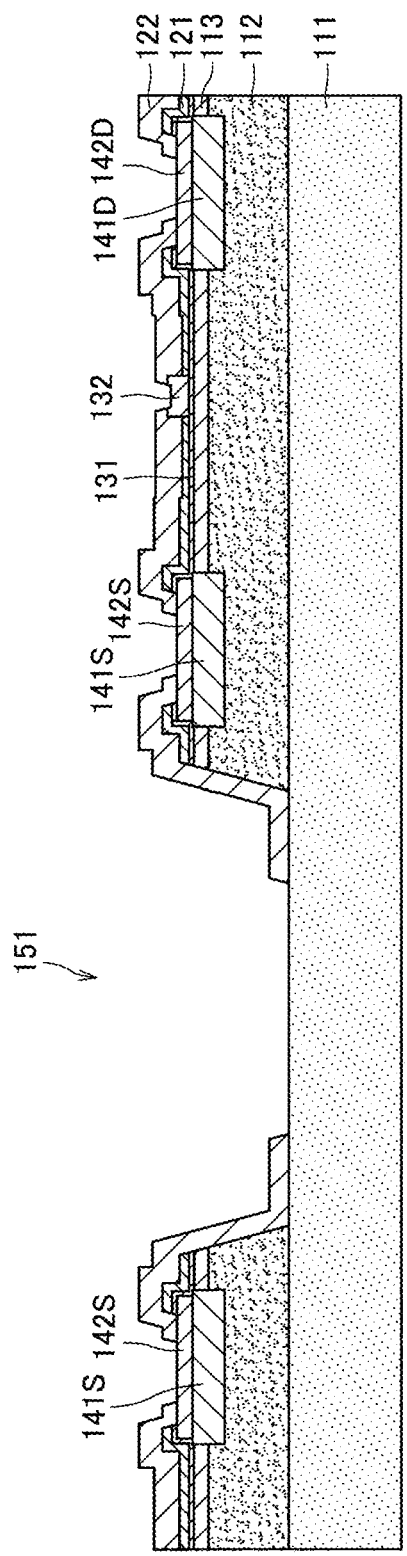
FIG. 6E is a schematic vertical cross-sectional diagram illustrating a step of the method of manufacturing the semiconductor device according to the embodiment.

Thereafter, as illustrated in FIG. 6E, the second insulating film 122 at the inner side of the substrate opening 151 and on the source electrode 142S, the drain electrode 142D, and the gate electrode 132 is etched. Specifically, by performing dry etching that uses CF4 and O2 gases, the second insulating film 122 at the inner side of the substrate opening 151 and on the source electrode 142S, the drain electrode 142D, and the gate electrode 132 is removed. At this time, the charges generated by the plasma of the etching process escape to the semiconductor substrate 111 exposed by the substrate opening 151. Accordingly, the charges are prevented from flowing into the gate insulating film 131.

To allow the charges to escape to the semiconductor substrate 111 via the substrate opening 151, it is important that the semiconductor substrate 111 be exposed prior to exposure of the source electrode 142S, the drain electrode 142D, and the gate electrode 132 in the etching process.

Accordingly, the second insulating film 122 at the inner side of the substrate opening 151 may be formed to be thinner than the second insulating film 122 on the source electrode 142S, the drain electrode 142D, and the gate electrode 132. Alternatively, the second insulating film 122 at the inner side of the substrate opening 151 may be so formed as to allow the etching to progress faster than the second insulating film 122 on the source electrode 142S, the drain electrode 142D, and the gate electrode 132 by controlling a material or a stack structure thereof. Alternatively, the second insulating film 122 at the inner side of the substrate opening 151 may be so formed as to allow the etching to progress faster than the second insulating film 122 on the source electrode 142S, the drain electrode 142D, and the gate electrode 132 by means of a microloading effect.

In FIG. 6E, the second insulating film 122 at the inner side of the substrate opening 151 and that on the source electrode 142S, the drain electrode 142D, and the gate electrode 132 are removed at the same time, but a technique according to the present disclosure is not limited to the above example. For example, the second insulating film 122 at the inner side of the substrate opening 151 and on the source electrode 142S and the drain electrode 142D may be removed first, following which the second insulating film 122 on the gate electrode 132 may be removed. Alternatively, the second insulating film 122 at the inner side of the substrate opening 151 and on the gate electrode 132 may be removed, following which the second insulating film 122 on the source electrode 142S and the drain electrode 142D may be removed.

Figure 6F:
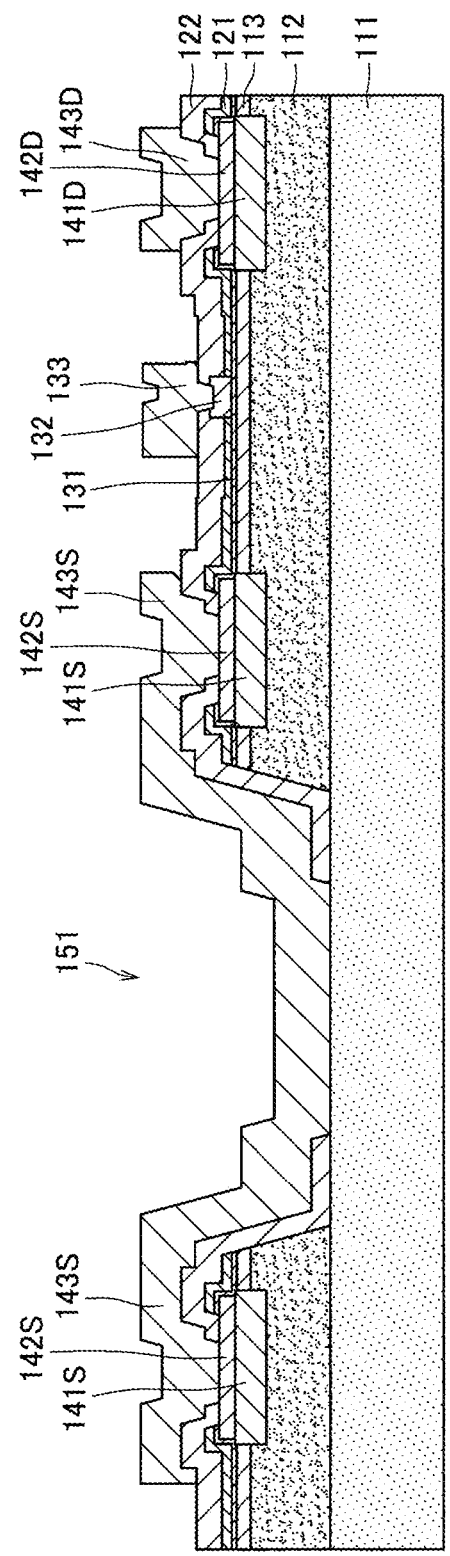
FIG. 6F is a schematic vertical cross-sectional diagram illustrating a step of the method of manufacturing the semiconductor device according to the embodiment.

Next, as illustrated in FIG. 6F, the source wiring line layer 143S, the drain wiring line layer 143D, and the gate wiring line layer 133 are respectively formed on the source electrode 142S, the drain electrode 142D, and the gate electrode 132. Specifically, Ti, Pt, and Au are sequentially stacked on the openings formed on the second insulating film 122 in the process illustrated in FIG. 6E, to thereby form the source wiring line layer 143S, the drain wiring line layer 143D, and the gate wiring line layer 133. At this time, the source wiring line layer 143S may also be formed at the inner side of the substrate opening 151 to electrically couple the source electrode 142S divided by the substrate opening 151.

Figure 6G:
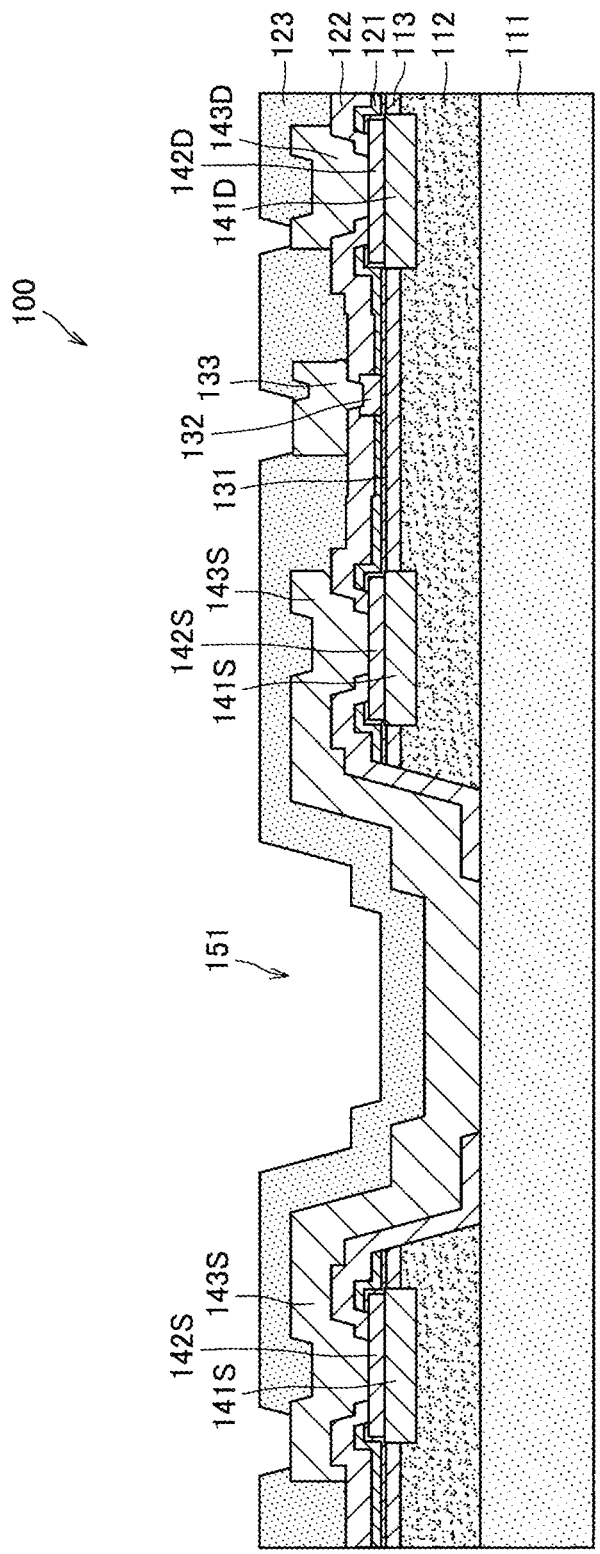
FIG. 6G is a schematic vertical cross-sectional diagram illustrating a step of the method of manufacturing the semiconductor device according to the embodiment.
Figure 6H:
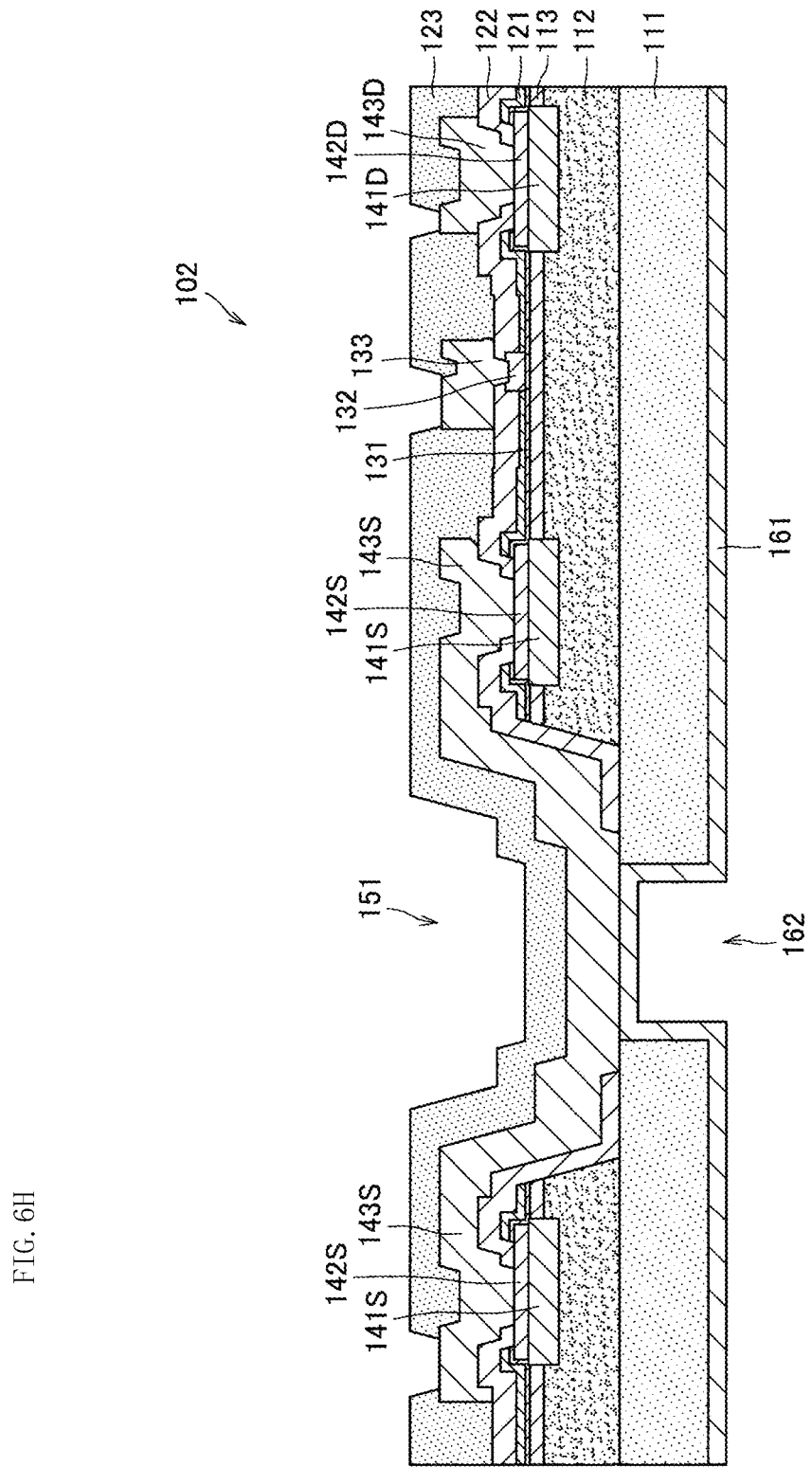
FIG. 6H is a schematic vertical cross-sectional diagram illustrating a process of manufacturing the semiconductor device according to the second modification example from the semiconductor device according to the embodiment.

Subsequently, as illustrated in FIG. 6G, the third insulating film 123 is formed on the source wiring line layer 143S, the drain wiring line layer 143D, and the gate wiring line layer 133.

Specifically, the third insulating film 123 is formed by SiN on the source wiring line layer 143S, the drain wiring line layer 143D, and the gate wiring line layer 133. Thereafter, a portion of the third insulating film 123 is removed by dry etching that uses CF4 and O2 gases to thereby expose each of the source wiring line layer 143S, the drain wiring line layer 143D, and the gate wiring line layer 133. It should be noted that the charges generated by the plasma at the time of the etching in the process illustrated in FIG. 6G escape to the semiconductor substrate 111 at the inner side of the substrate opening 151 via the source wiring line layer 143S. Accordingly, it is possible for the substrate opening 151 to suppress the generation of the PID even in such a process.

Through the above processes, it is possible to manufacture the semiconductor device 100 according to the present embodiment. According to such a manufacturing method, it is possible to suppress the generation of the PID in the semiconductor device 100.

In addition, as illustrated in FIG. 6H, by providing the opening 162 that penetrates the semiconductor substrate 111 in the semiconductor device 100 and forming the conductor layer 161 along the opening 162, it is possible to manufacture the semiconductor device 102 according to the second modification example.

Specifically, the semiconductor substrate 111 is etched from the surface positioned on the opposite side of the side on which the substrate opening 151 is provided, to thereby form the opening 162 that penetrates the semiconductor substrate 111 and exposes the source wiring line layer 143S. Subsequently, Ti, Pt, and Au are sequentially stacked at the inner side of the opening 162 and along the surface, of the semiconductor substrate 111, that is positioned on the opposite side of the side on which the substrate opening 151 is provided; hence, it is possible to form the conductor layer 161 electrically coupled to the source wiring line layer 143S.

Through the above processes, it is possible to manufacture the semiconductor device 102 according to the second modification example from the semiconductor device 100 according to the present embodiment.

Figure 7A:
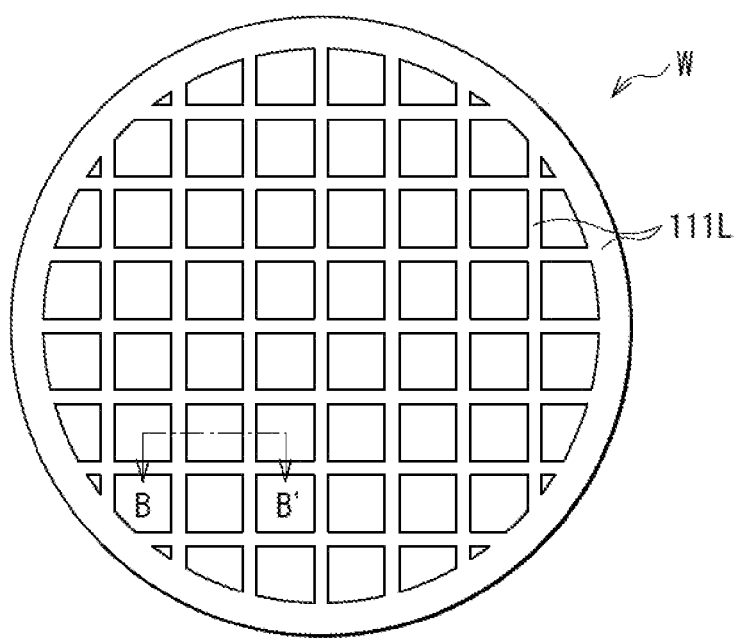
FIG. 7A is a schematic plan diagram for describing a step of manufacturing the semiconductor device according to the third modification example.
Figure 7B:
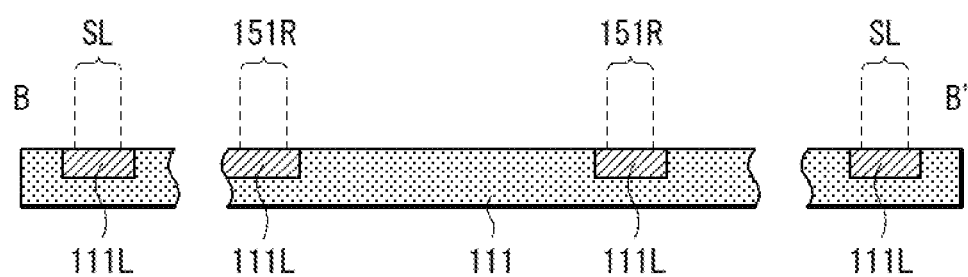
FIG. 7B is a schematic diagram illustrating a cross-sectional configuration taken along the line B-B' illustrated in FIG. 7A.
Figure 8A:
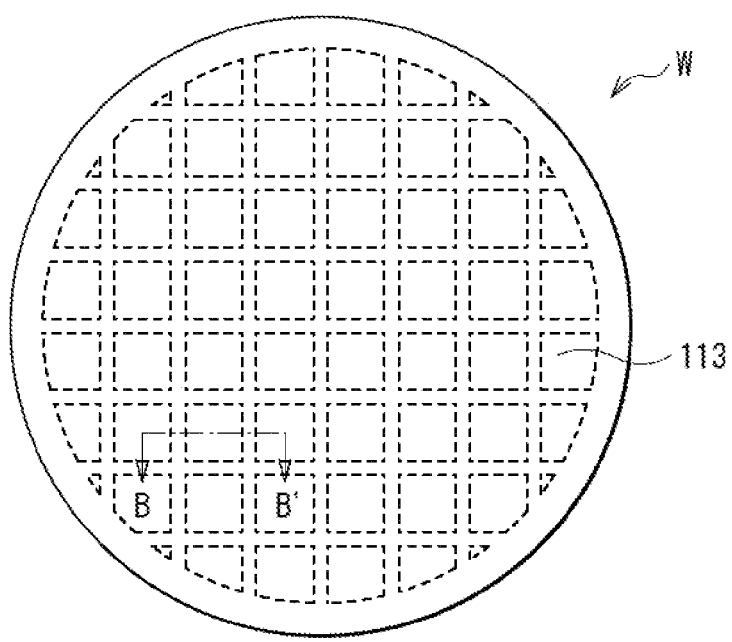
FIG. 8A is a schematic plan diagram for describing a step of manufacturing the semiconductor device according to the third modification example.
Figure 8B:
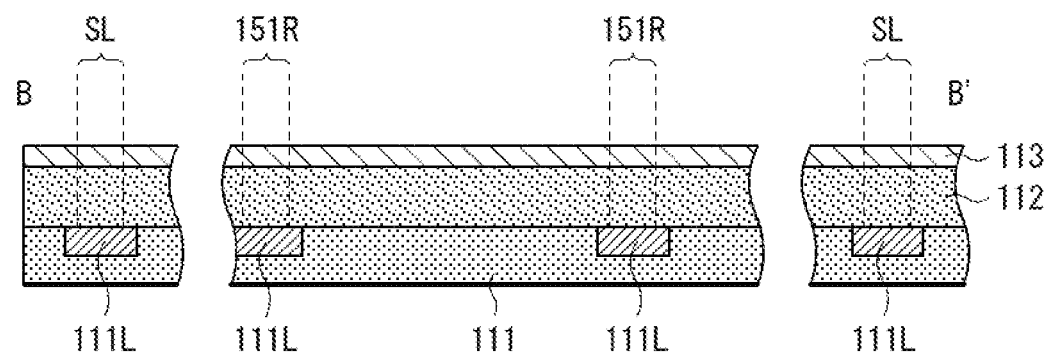
FIG. 8B is a schematic diagram illustrating a cross-sectional configuration taken along the line B-B' illustrated in FIG. 8A.

4.2. Semiconductor Device Manufacturing Method According to Third Modification Example Next, referring to FIGS. 7A to 8B, a method of manufacturing the semiconductor device 103 according to the third modification example will be described. FIGS. 7A and 8A are schematic plan diagrams for describing respective steps of the method of manufacturing the semiconductor device 103 according to the third modification example. FIG. 7B illustrates a cross-sectional configuration taken along the line B-B' illustrated in FIG. 7A, and FIG. 8B illustrates a cross-sectional configuration taken along the line B-B' illustrated in FIG. 8A. Note that FIGS. 7A to 8B illustrate a wafer W prior to a scribing process. The semiconductor device 103 is formed by cutting the wafer W along the scribe line (a scribe line SL in FIGS. 7B and 8B to be described later).

First, as illustrated in FIGS. 7A and 7B, the low resistance region 111L is formed in the vicinity of one of surfaces of the semiconductor substrate 111. The low resistance region 111L is preferably formed to be dispersed throughout the semiconductor substrate 111, and is formed in a grid shape, for example. By so forming the low resistance region 111L as to be dispersed over the entire semiconductor substrate 111, the charges generated by the plasma during the etching in the later step of etching the second insulating film 122 are more easily diffused to the entire surface of the semiconductor substrate 111 through the low resistance region 111L. The low resistance region 111L is selectively formed in, for example, a formation scheduled region 151R of the substrate opening 151 and a formation scheduled region SL of the scribe line SL. The low resistance region 111L is formed, for example, by ion implantation into the semiconductor substrate 111. The ion species used for the ion implantation may be selected in accordance with a conduction type of the low resistance region 111L, and examples thereof include phosphorus (P), arsenic (As), and boron (B). The low resistance region 111L may be formed by a method such as a diffusing method. Note that in FIGS. 7A and 8A, the formation scheduled region 151R of the substrate opening 151 is not illustrated.

After the low resistance region 111L is formed, the channel layer 112 and the barrier layer 113 are formed in this order on the entire surface, of the semiconductor substrate 111, that is on the side on which the low resistance region 111L is formed, as illustrated in FIGS. 8A and 8B. The channel layer 112 and the barrier layer 113 are formed using, for example, epitaxial growth, as described above. It is possible to manufacture the semiconductor device 103 by the subsequent steps that are similar to those described with reference to FIGS. 6A to 6G.

5. APPLICATION EXAMPLES

Figure 9:
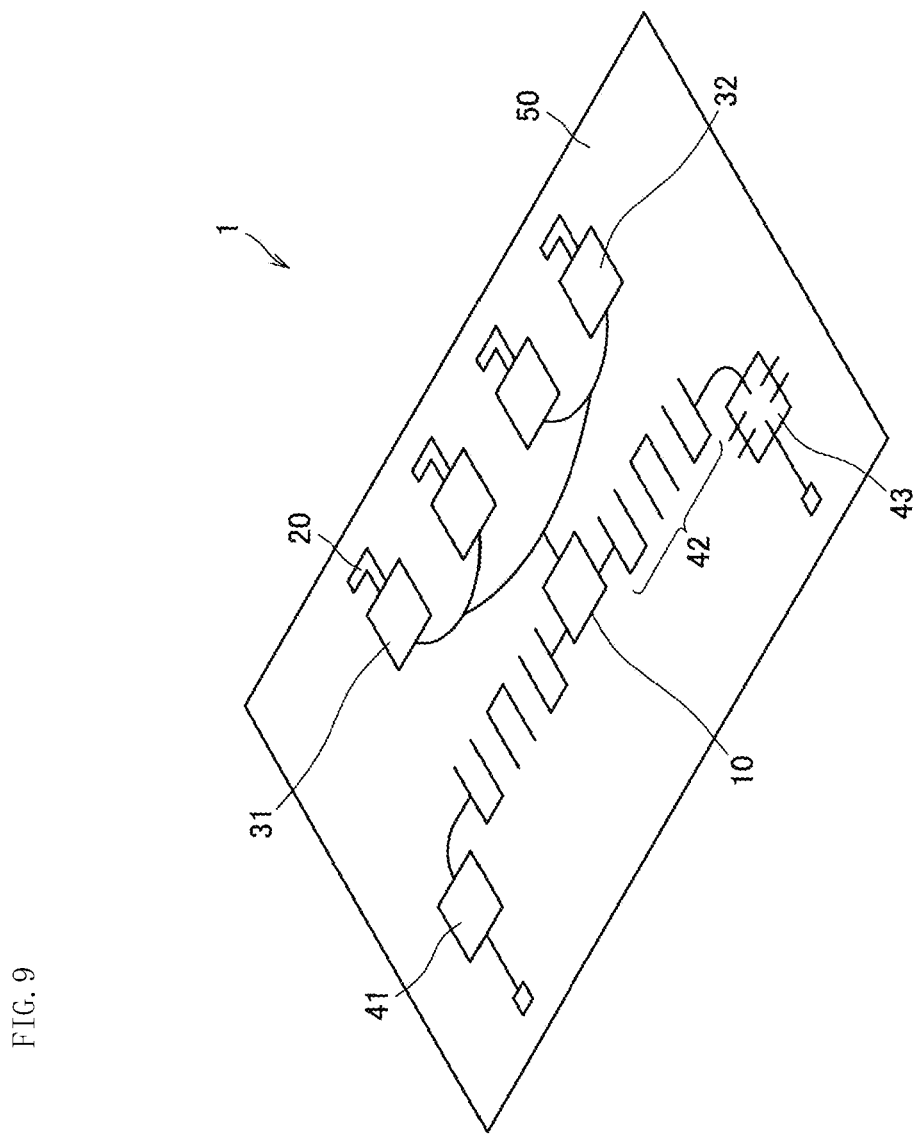
FIG. 9 is a schematic perspective diagram for describing a communication module to which the semiconductor device according to the embodiment is applied.

Next, referring to FIG. 9, a communication module to which the semiconductor device 100 according to the present embodiment is applied will be described. FIG. 9 is a schematic perspective diagram for describing the communication module to which the semiconductor device 100 according to the present embodiment is applied.

As illustrated in FIG. 9, a communication module 1 may include, for example, an edge antenna 20, a driver 31, a phase adjusting circuit 32, a switch 10, a low noise amplifier 41, a bandpass filter 42, and a power amplifier 43.

The communication module 1 is an antenna-integrated module in which the array-shaped edge antenna 20 and front-end components including the switch 10, the low noise amplifier 41, the bandpass filter 42, and the power amplifier 43 are integrally mounted as one module. The communication module 1 may be used, for example, as a communication module of a communication device such as a mobile phone or a smartphone, or as a communication module of a communication device for IoT (Internet of Things).

It is possible to configure each of the transistors configuring the respective switch 10, low noise amplifier 41, and power amplifier 43 included in the communication module 1 by, for example, the semiconductor device 100 according to the present embodiment. According to the semiconductor device 100 of the present embodiment, it is possible to form a switch or an amplifier having low losses and low distortion. Hence, it is possible to improve the quality of a signal of the communication module 1.

A preferred embodiment(s) of the present disclosure has/have been described above in detail with reference to the accompanying drawings, but the technical scope of the present disclosure is not limited to such an embodiment(s). It is apparent that a person having ordinary skill in the art of the present disclosure may arrive at various alterations and modifications within the scope of the technical idea described in the appended claims, and it is understood that such alterations and modifications naturally fall within the technical scope of the present disclosure.

Furthermore, the effects described herein are merely illustrative and exemplary, and not limitative. That is, a technique according to the present disclosure may exert other effects that are apparent to those skilled in the art from the description herein, in addition to the above-described effects or in place of the above-described effects.

Note that the technical scope of the present disclosure also includes the following configurations.

(1)
A semiconductor device including:
a semiconductor substrate;
a channel layer formed on the semiconductor substrate and includes a first compound semiconductor;
a barrier layer formed on the channel layer and includes a second compound semiconductor that is different from the first compound semiconductor;
a gate electrode provided on the barrier layer via a gate insulating film;
a source electrode and a drain electrode provided on the channel layer with the gate electrode interposed therebetween;
a substrate opening that penetrates the channel layer and exposes the semiconductor substrate;
an insulating film provided from upper parts of the gate electrode, the source electrode, and the drain electrode to an inner side of the substrate opening; and
a wiring line layer provided on the insulating film, and electrically coupled to one of the gate electrode, the source electrode, and the drain electrode via an opening provided on the insulating film, in which
at least a portion of the substrate opening is formed in an activation region in which the gate electrode, the source electrode, and the drain electrode are provided.

(2)
The semiconductor device according to (1), in which the insulating film is provided from the upper parts of the gate electrode, the source electrode, and the drain electrode to a portion of a bottom surface of the substrate opening.

(3)
The semiconductor device according to (1) or (2), in which the substrate opening is formed in the activation region positioned on the source electrode side with respect to the gate electrode.

(4)
The semiconductor device according to (3), in which
the source electrode is divided by the substrate opening, and
the divided source electrode is electrically coupled by the wiring line layer formed at the inner side of the substrate opening.

(5)
The semiconductor device according to (4), further including a conductor layer provided along an opening and electrically coupled to the wiring line layer formed at the inner side of the substrate opening, the opening penetrating the semiconductor substrate from a surface positioned on an opposite side of a side on which the substrate opening is provided.

(6)
The semiconductor device according to any one of (1) to (5), further including a contact layer that penetrates the barrier layer between each of the source electrode and the drain electrode and the channel layer.

(7)
The semiconductor device according to any one of (1) to (6), in which the semiconductor substrate has an electric resistivity of 1000 Ω·cm or more.

(8)
The semiconductor device according to any one of (1) to (7), in which the first compound semiconductor and the second compound semiconductor are $Al_{1-a-b}Ga_aIn_bN$ (where $0 \leq a \leq 1$, $0 \leq b \leq 1$, and $a+b \leq 1$).

(9)
The semiconductor device according to any one of (1) to (8), in which a dielectric constant of the gate insulating film is higher than a dielectric constant of the insulating film.

(10)
The semiconductor device according to any one of (1) to (9), in which
the semiconductor substrate has a low resistance region in vicinity of a surface, of the semiconductor substrate, that is on a side on which the substrate opening is provided, the low resistance region having an electric resistivity lower than an electric resistivity of any other part of the semiconductor substrate, and
at least a portion of the low resistance region of the semiconductor substrate is exposed in the substrate opening.

(11)
The semiconductor device according to any one of (1) to (10), in which the electric resistivity of the low resistance region is less than 1000 Ω·cm.

(12)
A semiconductor device including:
a semiconductor substrate;
a channel layer formed on the semiconductor substrate and includes a first compound semiconductor;
a barrier layer formed on the channel layer and includes a second compound semiconductor that is different from the first compound semiconductor;

a gate electrode provided on the barrier layer via a gate insulating film;
a source electrode and a drain electrode provided on the channel layer with the gate electrode interposed therebetween;
a substrate opening that penetrates the channel layer and exposes the semiconductor substrate;
an insulating film provided from upper parts of the gate electrode, the source electrode, and the drain electrode to an inner side of the substrate opening; and
a low resistance region provided in vicinity of a surface, of the semiconductor substrate, that is on a side on which the substrate opening is provided, and having an electric resistivity lower than an electric resistivity of any other part of the semiconductor substrate, in which
at least a portion of the low resistance region of the semiconductor substrate is exposed in the substrate opening.

(13)
A communication module with a semiconductor device, the semiconductor device including:
a semiconductor substrate;
a channel layer formed on the semiconductor substrate and includes a first compound semiconductor;
a barrier layer formed on the channel layer and includes a second compound semiconductor that is different from the first compound semiconductor;
a gate electrode provided on the barrier layer via a gate insulating film;
a source electrode and a drain electrode provided on the channel layer with the gate electrode interposed therebetween;
a substrate opening that penetrates the channel layer and exposes the semiconductor substrate;
an insulating film provided from upper parts of the gate electrode, the source electrode, and the drain electrode to an inner side of the substrate opening; and
a wiring line layer provided on the insulating film, and electrically coupled to one of the gate electrode, the source electrode, and the drain electrode via an opening provided on the insulating film, in which
at least a portion of the substrate opening is formed in an activation region in which the gate electrode, the source electrode, and the drain electrode are provided.

(14)
A semiconductor device manufacturing method including:
forming, with a first compound semiconductor, a film of a channel layer on a semiconductor substrate;
forming, with a second compound semiconductor that is different from the first compound semiconductor, a film of a barrier layer on the channel layer;
forming a source electrode and a drain electrode on the channel layer;
forming a gate electrode via a gate insulating film on the barrier layer between the source electrode and the drain electrode;
forming a substrate opening at a portion of an activation region in which the gate electrode, the source electrode, and the drain electrode are provided, the substrate opening penetrating the channel layer;
forming a film of an insulating film from upper parts of the gate electrode, the source electrode, and the drain electrode to an inner side of the substrate opening;
forming an opening on the insulating film while exposing the semiconductor substrate via the substrate opening, the opening exposing one of the gate electrode, the source electrode, and the drain electrode; and
forming a wiring line layer on the insulating film, the wiring line layer being electrically coupled to one of the gate electrode, the source electrode, and the drain electrode via the opening formed on the insulating film.

(15)
The semiconductor device manufacturing method according to claim 13, further including forming, with ion implantation, a low resistance region in vicinity of one of surfaces of the semiconductor substrate, the low resistance region having an electric resistivity lower than an electric resistivity of any other part of the semiconductor substrate, in which
at least a portion of the low resistance region is exposed upon the forming the substrate opening.

The present application claims the benefit of Japanese Priority Patent Application JP2018-204939 filed with the Japan Patent Office on Oct. 31, 2018, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A semiconductor device, comprising:
a semiconductor substrate;
a channel layer that is formed on the semiconductor substrate and that includes a first compound semiconductor;
a barrier layer that is formed on the channel layer and that includes a second compound semiconductor that is different from the first compound semiconductor;
a gate electrode provided on the barrier layer via a gate insulating film;
a source electrode and a drain electrode provided on the channel layer with the gate electrode interposed therebetween;
a substrate opening that penetrates the channel layer and exposes the semiconductor substrate;
an insulating film provided from upper parts of the gate electrode, the source electrode, and the drain electrode to an inner side of the substrate opening; and
a wiring line layer provided on the insulating film and electrically coupled to one of the gate electrode, the source electrode, and the drain electrode via an opening provided on the insulating film,
wherein at least a portion of the substrate opening is formed in an activation region in which the gate electrode, the source electrode, and the drain electrode are provided,
wherein the substrate opening is formed in the activation region positioned on the source electrode side with respect to the gate electrode,
wherein the source electrode is divided by the substrate opening, and
wherein the divided source electrode is electrically coupled by the wiring line layer formed at the inner side of the substrate opening.

2. The semiconductor device according to claim 1, wherein the insulating film is provided from the upper parts of the gate electrode, the source electrode, and the drain electrode to a portion of a bottom surface of the substrate opening.

3. The semiconductor device according to claim 1, wherein the semiconductor substrate has an electric resistivity of 1000 $\Omega\cdot$cm or more.

4. The semiconductor device according to claim 1, wherein the first compound semiconductor and the second compound semiconductor are $Al_{1-a-b}Ga_aIn_bN$ (where $0 \leq a \leq 1$, $0 \leq b \leq 1$, and $a+b \leq 1$).

5. The semiconductor device according to claim 1, wherein a dielectric constant of the gate insulating film is higher than a dielectric constant of the insulating film.

6. The semiconductor device according to claim 1, wherein the semiconductor substrate has a low resistance region in a vicinity of a surface of the semiconductor substrate that is on a side on which the substrate opening is provided, the low resistance region having an electric resistivity lower than an electric resistivity of any other part of the semiconductor substrate, and
wherein at least a portion of the low resistance region of the semiconductor substrate is exposed in the substrate opening.

7. The semiconductor device according to claim 1, further comprising a conductor layer provided along an opening and electrically coupled to the wiring line layer formed at the inner side of the substrate opening, the opening penetrating the semiconductor substrate from a surface positioned on an opposite side of a side on which the substrate opening is provided.

8. A semiconductor device, comprising:
a semiconductor substrate;
a channel layer that is formed on the semiconductor substrate and that includes a first compound semiconductor;
a barrier layer that is formed on the channel layer and that includes a second compound semiconductor that is different from the first compound semiconductor;
a gate electrode provided on the barrier layer via a gate insulating film;
a source electrode and a drain electrode provided on the channel layer with the gate electrode interposed therebetween;
a substrate opening that penetrates the channel layer and exposes the semiconductor substrate;
an insulating film provided from upper parts of the gate electrode, the source electrode, and the drain electrode to an inner side of the substrate opening;
a wiring line layer provided on the insulating film and electrically coupled to one of the gate electrode, the source electrode, and the drain electrode via an opening provided on the insulating film, wherein
at least a portion of the substrate opening is formed in an activation region in which the gate electrode, the source electrode, and the drain electrode are provided; and
a contact layer that penetrates the barrier layer between each of the source electrode and the drain electrode and the channel layer.

9. The semiconductor device according to claim 8, wherein the substrate opening is formed in the activation region positioned on the source electrode side with respect to the gate electrode.

10. The semiconductor device according to claim 9, wherein
the source electrode is divided by the substrate opening, and
the divided source electrode is electrically coupled by the wiring line layer formed at the inner side of the substrate opening.

11. The semiconductor device according to claim 10, further comprising a conductor layer provided along an opening and electrically coupled to the wiring line layer formed at the inner side of the substrate opening, the opening penetrating the semiconductor substrate from a surface positioned on an opposite side of a side on which the substrate opening is provided.

12. The semiconductor device according to claim 8, wherein the semiconductor substrate has a low resistance region in a vicinity of a surface of the semiconductor substrate that is on a side on which the substrate opening is provided, the low resistance region having an electric resistivity lower than an electric resistivity of any other part of the semiconductor substrate, and
wherein at least a portion of the low resistance region of the semiconductor substrate is exposed in the substrate opening.

13. The semiconductor device according to claim 8, wherein the semiconductor substrate has an electric resistivity of 1000 $\Omega \cdot cm$ or more.

14. The semiconductor device according to claim 8, wherein the first compound semiconductor and the second compound semiconductor are $Al_{1-a-b}Ga_aIn_bN$ (where $0 \leq a \leq 1$, $0 \leq b \leq 1$, and $a+b \leq 1$).

15. The semiconductor device according to claim 8, wherein a dielectric constant of the gate insulating film is higher than a dielectric constant of the insulating film.

16. A semiconductor device, comprising:
a semiconductor substrate;
a channel layer that is formed on the semiconductor substrate and that includes a first compound semiconductor;
a barrier layer that is formed on the channel layer and that includes a second compound semiconductor that is different from the first compound semiconductor;
a gate electrode provided on the barrier layer via a gate insulating film;
a source electrode and a drain electrode provided on the channel layer with the gate electrode interposed therebetween;
a substrate opening that penetrates the channel layer and exposes the semiconductor substrate;
an insulating film provided from upper parts of the gate electrode, the source electrode, and the drain electrode to an inner side of the substrate opening; and
a wiring line layer provided on the insulating film and electrically coupled to one of the gate electrode, the source electrode, and the drain electrode via an opening provided on the insulating film,
wherein at least a portion of the substrate opening is formed in an activation region in which the gate electrode, the source electrode, and the drain electrode are provided,
wherein the semiconductor substrate has a low resistance region in a vicinity of a surface of the semiconductor substrate that is on a side on which the substrate opening is provided, the low resistance region having an electric resistivity lower than an electric resistivity of any other part of the semiconductor substrate, and
wherein at least a portion of the low resistance region of the semiconductor substrate is exposed in the substrate opening.

17. The semiconductor device according to claim 16, wherein the electric resistivity of the low resistance region is less than 1000 $\Omega \cdot cm$.

18. A semiconductor device, comprising:
a semiconductor substrate;
a channel layer that is formed on the semiconductor substrate and that includes a first compound semiconductor;

a barrier layer that is formed on the channel layer and that includes a second compound semiconductor that is different from the first compound semiconductor;

a gate electrode provided on the barrier layer via a gate insulating film;

a source electrode and a drain electrode provided on the channel layer with the gate electrode interposed therebetween;

a substrate opening that penetrates the channel layer and exposes the semiconductor substrate;

an insulating film provided from upper parts of the gate electrode, the source electrode, and the drain electrode to an inner side of the substrate opening; and a low resistance region provided in a vicinity of a surface of the semiconductor substrate that is on a side on which the substrate opening is provided, and having an electric resistivity lower than an electric resistivity of any other part of the semiconductor substrate, wherein at least a portion of the low resistance region of the semiconductor substrate is exposed in the substrate opening.

19. A semiconductor device manufacturing method, comprising:

forming, with a first compound semiconductor, a film of a channel layer on a semiconductor substrate;

forming, with a second compound semiconductor that is different from the first compound semiconductor, a film of a barrier layer on the channel layer;

forming a source electrode and a drain electrode on the channel layer;

forming a gate electrode via a gate insulating film on the barrier layer between the source electrode and the drain electrode;

forming a substrate opening at a portion of an activation region in which the gate electrode, the source electrode, and the drain electrode are provided, the substrate opening penetrating the channel layer;

forming a film of an insulating film from upper parts of the gate electrode, the source electrode, and the drain electrode to an inner side of the substrate opening;

forming an opening on the insulating film while exposing the semiconductor substrate via the substrate opening, the opening exposing one of the gate electrode, the source electrode, and the drain electrode; and forming a wiring line layer on the insulating film, the wiring line layer being electrically coupled to one of the gate electrode, the source electrode, and the drain electrode via the opening formed on the insulating film.

20. The semiconductor device manufacturing method according to claim 19, further comprising forming, with ion implantation, a low resistance region in vicinity of one of surfaces of the semiconductor substrate, the low resistance region having an electric resistivity lower than an electric resistivity of any other part of the semiconductor substrate, wherein at least a portion of the low resistance region is exposed upon the forming the substrate opening.

* * * * *